(12) United States Patent
Yamazaki et al.

(10) Patent No.: US 7,812,440 B2
(45) Date of Patent: Oct. 12, 2010

(54) ELECTRONIC PACKAGE DEVICE, MODULE, AND ELECTRONIC APPARATUS

(75) Inventors: Takao Yamazaki, Tokyo (JP);
Yoshimichi Sogawa, Tokyo (JP);
Toshiaki Shironouchi, Kanagawa (JP);
Kenji Ohyachi, Kanagawa (JP)

(73) Assignee: NEC Corporation, Tokyo (JP)

( * ) Notice: Subject to any disclaimer, the term of this patent is extended or adjusted under 35 U.S.C. 154(b) by 56 days.

(21) Appl. No.: 12/223,963

(22) PCT Filed: Feb. 28, 2007

(86) PCT No.: PCT/JP2007/053724

§ 371 (c)(1),
(2), (4) Date: Aug. 14, 2008

(87) PCT Pub. No.: WO2007/102358

PCT Pub. Date: Sep. 13, 2007

(65) Prior Publication Data

US 2009/0065921 A1    Mar. 12, 2009

(30) Foreign Application Priority Data

Mar. 7, 2006    (JP) .............................. 2006-061237

(51) Int. Cl.
*H01L 23/053* (2006.01)
(52) U.S. Cl. ...................... 257/701; 257/784
(58) Field of Classification Search ................. 257/701,
257/686, 723, 724, 777, 782, 783, 784
See application file for complete search history.

(56) References Cited

U.S. PATENT DOCUMENTS

| | | | | |
|---|---|---|---|---|
| 6,300,679 | B1 * | 10/2001 | Mukerji et al. | 257/738 |
| 6,376,769 | B1 * | 4/2002 | Chung | 174/524 |
| 6,677,670 | B2 * | 1/2004 | Kondo | 257/686 |
| 6,841,862 | B2 | 1/2005 | Kikuchi et al. | |
| 6,856,009 | B2 * | 2/2005 | Bolken et al. | 257/686 |
| 6,977,441 | B2 * | 12/2005 | Hashimoto | 257/777 |
| 6,998,704 | B2 * | 2/2006 | Yamazaki et al. | 257/688 |
| 7,230,328 | B2 * | 6/2007 | Hazeyama et al. | 257/685 |
| 2002/0001937 | A1 | 1/2002 | Kikuchi et al. | |
| 2007/0096284 | A1 * | 5/2007 | Wallace | 257/686 |
| 2008/0048309 | A1 * | 2/2008 | Corisis et al. | 257/686 |

FOREIGN PATENT DOCUMENTS

| | | | |
|---|---|---|---|
| JP | 2001-144245 A | 5/2001 | |
| JP | 2002-083893 A | 3/2002 | |
| JP | 2004-172322 A | 6/2004 | |

\* cited by examiner

*Primary Examiner*—S. V Clark
(74) *Attorney, Agent, or Firm*—Foley & Lardner LLP

(57) ABSTRACT

There is provided an electronic device package and the like in which it is not likely that damage occurs in a wiring pattern of an interposer substrate in a gap section formed, for example, between an electronic device and an insertion substrate. The semiconductor package in accordance with the present invention is a package of fan-out type including an interposer substrate and a semiconductor device and an insertion substrate which are arranged on the substrate. The interposer substrate 3 includes a wiring pattern therein. A gap is formed between the semiconductor device and the insertion substrate; in an area corresponding to the gap, a reinforcing member (a metallic film 7) is formed to increase strength of the wiring pattern.

19 Claims, 29 Drawing Sheets

__US 7,812,440 B2__

ELECTRONIC PACKAGE DEVICE, MODULE, AND ELECTRONIC APPARATUS

This application is the National Phase of PCT/JP2007/053724, filed Feb. 28, 2007, which claims priority to Japanese Application No. 2006-061237, filed Mar. 7, 2006, the disclosures of which are hereby incorporated by reference in their entirety.

TECHNICAL FIELD

The present invention relates to an electronic device package in which all electronic devices required to operate an electronic apparatus are easily mounted therein (the mounting is facilitated by substantially expanding external terminals of electronic devices). In particular, the present invention relates to a packaging technique of fan-out type capable of freely changing external dimensions of the electronic device package. Additionally, the present invention relates to a module in which an electronic device package is mounted on a circuit board and to an electronic apparatus including the electronic device package.

RELATED ART

FIG. 1 is a cross-sectional view showing a semiconductor package described in Patent Document 1.

The semiconductor package 500 includes a semiconductor device 506 in which external electrodes (not shown) are formed on a circuit surface (a lower surface shown in FIG. 1), a flexible substrate including a thermoplastic insulating resin layer 504 on one of or both of the surfaces of a wiring pattern 505, and at least one insertion substrate 507 arranged in a periphery of the semiconductor device 506.

The flexible substrate 508 is provided with electrodes, which are connected to predetermined electrodes of the semiconductor device 506. Connecting sections between these electrodes are sealed using the thermoplastic insulating resin layer 504. The flexible substrate 508 is bent along a side surface of the insertion substrate 507, and external electrodes are formed on a surface of the semiconductor device 506 on which electrodes are to be formed and other surfaces of the semiconductor device 506.

The configuration described above is a package of so-called "fan-out" type and has one feature in which the pitch of the external electrodes on the flexible substrate 508 (reference is to be made to the distance between solder bumps 501 for reference) is wider than that of the external electrodes on the semiconductor device 506 (reference is to be made to the distance between bumps 502 for reference). Such structure is adopted for the following reason.

That is, at present, the technique to narrow the pitch of external terminals of the secondary mounting substrate (motherboard) on the side on which the semiconductor package is mounted cannot fully cope with the technique to shrink the semiconductor device (reduction in the external size). Hence, it is practically difficult to directly mount the single unit of the semiconductor device 506 on the motherboard or the like; therefore, to solve this difficulty, the structure of fan-out type is adopted.

Using the structure shown in FIG. 1, it is possible to implement a package which is larger in the outer size than the semiconductor device 506 and of which dimensions is freely changeable. Moreover, external terminals are provided on both surfaces (upper and lower surfaces) of the package; hence, when the package is combined with another package to be laminated onto each other, a three-dimensional mounting package can also be implemented.

Patent Document 1: Japanese Patent Laid-Open Publication Ser. No. 2004-172322

DISCLOSURE OF THE INVENTION

Problem to be Solved by the Invention

In a semiconductor package of fan-out type shown in FIG. 1 of which the external dimensions can be freely changed, Si which is equal in the coefficient of thermal expansion to the semiconductor device 506 (Si-based device) is employed for the insertion substrate 507 in some cases. No problem occurs in a situation wherein both members are equal in the coefficient of thermal expansion to each other as above; however, in a situation wherein the insertion substrate differs in the coefficient of linear expansion from the semiconductor device, a problem occurs as follows. For example, in a case wherein the semiconductor device 506 includes a material with a coefficient of linear expansion of 0.03 ppm and the insertion substrate (e.g., Cu) has a coefficient of linear expansion of 17 ppm, due to expansion and shrinkage of the flexible substrate 508 caused by the difference in the coefficient of thermal expansion between the semiconductor device 506 and the insertion substrate 507, the wiring on the flexible substrate, particularly, wiring 509 in the vicinity of a gap 510 between the semiconductor device 506 and the insertion substrate 507 is easily broken, resulting in a problem in which an open defect easily occurs.

The present invention has been devised in consideration of the above problem and has an object to provide an electronic device package and the like wherein in an electronic device package in which an electronic device and an insertion substrate are arranged on an interposer substrate, even if the electronic device and the insertion substrate are formed using mutually different materials, it is not likely that damage occurs in the wiring pattern of the interposer substrate in a gap section formed between, for example, the electronic device and the insertion substrate.

Means for Solving the Problem

An electronic device package of the present invention to achieve the above object is characterized by comprising a flexible interposer substrate including a wiring pattern therein, at least one electronic device arranged on the interposer substrate, and an insertion substrate similarly arranged on the interposer substrate, wherein in an area of the interposer substrate corresponding to a gap between the electronic device and the insertion substrate, a reinforcing member is disposed to increase breaking strength of the wiring pattern.

In accordance with the electronic device package of the present invention, since there is disposed a member that reinforces the wiring pattern, it is not likely that damage occurs in the wiring pattern in the gap section. "A reinforcing member" in the present invention may be, for example, a metallic film formed on the wiring pattern, and it is favorable that the metallic film includes a material which is higher in tensile strength than the wiring pattern. "A reinforcing member" may be additionally a structure formed by projecting a portion of the wiring pattern (to be referred to as "metallic projection") or may be a via filled with a conductor to connect wiring patterns to each other.

Effect of the Invention

In accordance with the electronic device package of the present invention, since there is disposed the reinforcing member that increases strength of the wiring pattern in the interposer substrate, it is not likely that damage occurs in the wiring pattern, leading to increase in reliability of the electronic device package.

BEST MODE FOR CARRYING OUT THE INVENTION

Next, referring to drawings, description will be given in detail of exemplary embodiments of the present invention. In this regard, the exemplary embodiments will be described using a semiconductor package as an example of the electronic device package of the present invention.

First Exemplary Embodiment

FIGS. 2 and 3 are cross-sectional views showing an electronic device package according to a first exemplary embodiment of the present invention.

The semiconductor package shown in FIG. 2 includes a semiconductor device 1, a flexible interposer substrate 3 including wiring patterns 6 and 6' of Cu, Al, or the like with a thickness ranging from 5 μm to 18 μm, and insertion substrates 2 and 18.

The semiconductor device 1 is, for example, a logic LSI. The insertion substrates 2 and 18 may include a plurality of members 2 as shown in FIG. 4 (top view) or a single frame-shaped member 18 as shown in FIG. 5 (top view). The insertion substrate 18 is, in other words, a member being a single flat plate with a through-hole formed in its central section.

In insulating resins used in the interposer substrate 3, at least sections on a side (inner-side surface) contacted with the semiconductor device 1 are favorably configured using a thermoplastic resin 10 (adhesive). As a result, the interposer substrate 3 is suitably fixed onto the semiconductor device 1. Also, since the thermoplastic resin 10 is formed in this fashion, the interposer substrate 3 is easily bent.

For the thermoplastic resin 10, there is employed, for example, a composite material composed of polyimide of denatured silicon and a flexible epoxy resin. In this case, by heating the resin 10 up to 150° C. to 200° C., the elastic modulus thereof lowers to a value equal to or less than several tens of MPa (an elastic modulus of about 1 GPa at the room temperature), the thermoplastic resin 10 is easily bent, and it hence prevents damage on the wiring pattern thus bent. Also, since the heating causes appearance of adhesive force, the interposer substrate 3 can be easily fixed onto the semiconductor device 1 and the insertion substrates 2 and 18. In addition, since stress imposed onto the semiconductor device 1 at assembly can be reduced, it is possible to make the semiconductor device 1 thinner, leading to a feature that the thickness of the final semiconductor package can be reduced.

The interposer substrate 3 is partly bent along a side surface and a rear surface of the substrates 2 and 18, while heated up to 150° C. to 200° C. Edge sections of the substrate bent as above are adhered to outer circumferential surfaces of the insertion substrates 2 and 18 and the upper surface of the semiconductor device 1 in the drawing.

Incidentally, the bent section covers both of the insertion plates and the semiconductor device in the present embodiment; however, in addition thereto, there may be employed a configuration in which the bent section covers, for example, only the insertion substrates (in other words, the bent section is pasted onto only the upper surface of the insertion substrates).

In the configurations shown in FIGS. 2 and 3, the interposer substrate 3 is bent at ends of two opposing sides of four sides of a rectangle formed by the substrates 2 and 18 shown in FIGS. 4 and 5. Although not shown in the drawings, in a situation wherein the wiring cannot be easily drawn using the two-side bending method, there may be naturally considered a method to bend the interposer substrate 3 at the ends of three sides or four sides of the rectangle formed by the substrates 2 and 18.

As the material of the substrates 2 and 18, it is possible to use Cu, ceramics, glass epoxy, BT resin, or the like; that is, both of a conductive material and an insulating material are available. In this connection, Cu has a coefficient of linear expansion (about 15 ppm) equivalent to a motherboard including an epoxy resin or a glass epoxy resin as a basic material. As for a specific quality of the ceramic, the glass epoxy, or the BT resin, a coefficient of linear expansion (9 ppm to 15 ppm) thereof is favorably similar to that of the motherboard, rather than the material quality of the semiconductor device 1. As FIGS. 2 and 3 show, these insertion substrates 2 and 18 have a thickness almost equal to that of the semiconductor device 1.

The semiconductor package (FIG. 2) of the present embodiment is primarily characterized in that the wiring pattern 6 is partly reinforced in the areas corresponding the gaps 8 between the semiconductor device 1 and the substrate 2. Concretely, metallic films 7 are formed in part of the wiring pattern 6 to partly reinforce the pattern 6.

The metallic films 7 are favorably formed using Ni, W, or the like which is higher in the tensile strength than the material (Cu, Al, or the like) of the wiring pattern; however, this is not limitative. These films may be formed using the plating method or the sputtering method, and the film thickness ranges, for example, from 1 μm to 5 μm.

By constructing the metallic films 7 as above, it is not likely that the wiring pattern 6 is broken at the gaps 8 due to thermal stress caused by the difference in the coefficient of linear expansion between the semiconductor device 1 and the substrate 2. Incidentally, "the areas corresponding the gaps 8" described above indicate areas A8 covering the gaps 8 as shown in FIG. 6. Since the metallic film 7 is formed in a size to include at least the area A8, the reinforcing function can be efficiently attained by the metallic film.

Referring to FIG. 3, description will be given of another example of the present embodiment. In the configuration of FIG. 3, the metallic film 7 is formed on the overall surface on one side of the wiring pattern 6, not only the area corresponding to the gap 8. Incidentally, the material of the metallic film 7 is also Ni (nickel), W (wolfram), or the like which is higher in the tensile strength than Cu and Al as above. In FIG. 3, the same constituent sections as those of FIG. 2 are assigned with the same reference numerals as those of FIG. 2.

As means to prevent the breakage of the wiring pattern due to thermal stress, there may be considered also a method in which, for example, there is disposed a dummy pattern (e.g., a conductor) in addition to the wiring pattern in the area corresponding to the gap 8. However, to form the dummy pattern in addition to the wiring pattern in the same surface, it is required to configure the wiring in a higher density. This hence reduces the wiring width, leading to a problem that the wiring strength is lowered and a desired effect cannot be obtained. Also, to improve the above problem, there may be considered means to dispose the dummy pattern in a layer other than that of the wiring pattern; however, in this situation, the number of wiring layers is increased by one, which results in a problem of increase in the production cost of the interposer substrate.

Next, description will be given of processes and the like to form the metallic films 7.

To partly form the metallic films 7 as shown in FIG. 2, a photolithography process is required. On the other hand, for the overall metallic films 7 as shown in FIG. 3, the photolithography process is not required. From the viewpoint of production cost, the configuration of FIG. 3 is advantageous.

However, although not shown in FIGS. 2 and 3, the wiring pattern 6 and the metallic film 7 actually exist in the bending sections of the interposer substrate, and there hence exists a fear of occurrence of the following problem. That is, due to existence of the metallic film 7 also in the bending sections, it is likely that the interposer substrate is not easily bent depending on the film thickness and hardness of the metallic film. In a situation wherein such problem occurs, it is favorable that the metallic film 7 is partly left remained as shown in FIG. 2 such that the metallic film 7 is absent from the bending sections.

Incidentally, although not particularly limitative, each section of the semiconductor package (FIGS. 2 and 3) of the present embodiment may be configured in detail as follows. As the semiconductor bump 5 to connect the semiconductor device 1 to the interposer substrate 3, there may be employed an Au stud bump or solder such as Sn—Pb, Sn—Ag, Sn—Ag—Cu, Sn—Bi, or Sn—Zn. By the semiconductor bump 5, there is established flip-chip connection between the semiconductor device 1 and the interposer substrate 3 (precisely, the wiring pattern 6 thereof).

In an inner circumferential surface (opposing the bump 5) of the interposer substrate 3, a hole is beforehand disposed. The hole may be arranged through machining using, for example, a UV-YAG laser, a carbon dioxide laser, or an excimer laser. In this connection, the present invention is not limited to the configuration in which the hole is arranged in advance. In a situation wherein a thermoplastic resin 10 is adopted as the insulating resin, the conductor bump 5 may stick through the thermoplastic resin layer to electrically connect to the wiring pattern 6. In this case, at the moment when the conductor bump 5 electrically connects to the wiring pattern 6, the conductor bump 5 is sealed up by the thermoplastic resin.

When the conductor bump 5 is an Au stud bump, an Au film (with a thickness ranging from, e.g., 0.1 μm to 1 μm) or a film of solder (with a thickness ranging from, e.g., 3 μm to 10 μm) may be formed on the surface of the metallic film 7 on the wiring pattern 6. The Au film can be formed using a plating method or a sputtering method. When the Au film is formed on the surface of the metallic film 7, the Au stud bump 5 is connected to the Au film using a thermal crimping method or an ultrasonic joining method. The film of solder may specifically include Sn—Pb, Sn—Ag, Sn—Ag—Cu, Sn—Bi, or Sn—Zn and can be formed using a plating method. When the solder film of SnAg or the like is formed on the surface of the metallic film 7, the Au stud bump 5 is connected by use of a thermal crimping method and reflow, to the solder by welding.

In the insulating resin on the surface of the interposer substrate 3 on which the solder bump 4 is mounted, there is beforehand formed a hole in which a wiring pattern is exposed. An electrode pad 17 is a conductive film formed on the exposure surface and includes, for example, a material produced using a plating method or a sputtering method such as Au, Ni/Au, Pd, Sn, SnAg, SnAgCu, or SnPb. Incidentally, as a method of forming a hole in the insulating resin layer, there may be employed a laser machining process using a UV-YAG laser, a carbon dioxide laser, or an excimer laser. Or, if the insulating resin layer includes a photosensitive resin, a photolithography process is also available.

Incidentally, in the semiconductor package of the present embodiment shown in FIGS. 2 and 3, the interposer substrate 3 has two-layer wiring structure, but the present invention is not restricted by the present embodiment. As for the wiring layers of the interposer substrate 3, the substrate may also include one layer or three layers or more. Additionally, FIGS. 2 and 3 shows an example in which the semiconductor device 1 is mounted with the face-down mode (the circuit surface faces downward); however, there naturally exists a case in which the device 1 is mounted with the face-up mode (the circuit surface faces upward).

Naturally, such remarks are not limited only to the present embodiment, but are also similarly applied to respective exemplary embodiments which will be described later; therefore, explanation thereof will be omitted for the respective exemplary embodiments hereinbelow. For example, the wiring layer structure of the interposer substrate 3 is not limited to two layers, but there also exists a case of one layer or a case of three layers or more. Also, the mounting method of the semiconductor device 1 is the face-down mounting or the face-up mounting depending on cases. Next, using several exemplary embodiments as examples, description will be specifically given of the present invention; it is also possible to appropriately combine configurations of the respective exemplary embodiments with each other.

Second Exemplary Embodiment

FIG. 7 is a cross-sectional view showing a semiconductor package according to a second exemplary embodiment of the present invention.

The semiconductor package of FIG. 4 is similar in structure to the semiconductor package of the first exemplary embodiment (see FIGS. 2 and 3), but differs in the number of semiconductor devices 1 therefrom. That is, according to the configuration of FIG. 7, two semiconductor devices 1 are accommodated in the configuration. If the external dimensions of the semiconductor device 1 are small, a plurality of semiconductor devices 1 can be mounted flatways on the interposer substrate 3 to thereby produce the semiconductor package of the second exemplary embodiment as shown in FIG. 7.

As FIGS. 8 and 9 show, the present embodiment may be naturally combined with the configurations shown in FIGS. 4 and 5. In FIG. 8, two semiconductor devices 1 are accommodated in a through-hole (indicating an opening at the central section) configured by a plurality of insertion substrates 2. In FIG. 9, there is employed one substrate 18 including an opening.

Incidentally, the configuration of FIG. 7 is an example in which the metallic film 7 is formed on the overall surface of the wiring pattern 6. However, this does not restrict the metallic film 7, namely, the film 7 may be formed, not on the overall surface of the wiring pattern 6, but only in an area corresponding to the gap 8 as in the configuration of FIG. 2.

Third Exemplary Embodiment

FIG. 10 is a cross-sectional view showing a third exemplary embodiment of a semiconductor package of the present invention.

The semiconductor package of FIG. 10 is similar in structure to that shown in FIG. 7, but differs from the second exemplary embodiment (the circuit surface of the semiconductor device 1 is on the lower side (face-down mounting)) in that the circuit surface of the semiconductor device 1 is on the upper side (face-up mounting).

When the semiconductor device 1 to be used has a high operation frequency, it is in general required to reduce the distance between the device 1 and a second mounting substrate. In this situation, it is favorable that the circuit surface of the semiconductor device 1 is on the lower side as in the configuration of FIG. 7. In contrast thereto, if one of the semiconductor devices 1 is a photodiode or any other light receiving element, it is required to arrange the device 1 with the circuit surface facing upward due to its characteristic; hence, it is favorable to employ the configuration of the present embodiment (see FIG. 10). The circuit surface of the device 1 faces upward shown in the drawing, and the semiconductor device 1 is electrically connected via the conductive bump 5 to the wiring pattern 6.

Fourth Exemplary Embodiment

FIG. 11 is a cross-sectional view showing a semiconductor package according to a fourth exemplary embodiment of the present invention.

The semiconductor package of FIG. 11 is similar in structure to that shown in FIGS. 2 and 3, but differs therefrom only in that the interposer substrate 3 is bent only at an end of one of the four sides of a rectangle configured by the substrates 2 and 18 (reference is to be made to FIGS. 4 and 5).

Such structure is suitable when the wiring pitch (line width+space) of the interposer substrate 3 is relatively loose (wide). Contrarily, if the desired wiring pitch is narrow, it is favorable to use the configuration shown in FIGS. 2 and 3. In this connection, by using the configuration in which the interposer substrate 3 is bent on the opposing two sides (or, three or four sides) of the substrates 2 and 18 as shown in FIGS. 2 and 3, it is possible depending on cases to produce the package with higher yield and lower cost in consideration of the assembly positional precision.

Fifth Exemplary Embodiment

FIG. 12 is a cross-sectional view showing a semiconductor package according to a fifth exemplary embodiment of the present invention.

The semiconductor package of FIG. 12 is similar in structure to that shown in FIGS. 2 and 3, but differs therefrom only in that the metallic film 7 is formed on both surfaces of the wiring pattern 6. Since the film 7 is formed on both surfaces of the wiring pattern 6, the strength of the configuration increases when compared with that in which the film 7 is configured only on one surface of the pattern 6.

Incidentally, although FIG. 12 shows a case wherein the metallic film 7 is formed on the overall surface of the wiring pattern 6, the film 7 not disposed on the overall surface, but is formed on an area corresponding to the gap 8 and on both surfaces of the pattern.

Sixth Exemplary Embodiment

FIG. 13 is a cross-sectional view showing a semiconductor package according to a sixth exemplary embodiment of the present invention.

The semiconductor package of FIG. 13 is similar in structure to that shown in FIG. 12, but differs therefrom only in that the interposer substrate 3 is bent only at an end of one of the four sides of the rectangle configured by the substrates 2 and 18 (reference is to be made to FIGS. 4 and 5).

Seventh Exemplary Embodiment

FIG. 14 is a cross-sectional view showing a semiconductor package according to a seventh exemplary embodiment of the present invention.

The semiconductor package of FIG. 14 is similar in structure to that shown in FIGS. 2 and 3, but differs therefrom only in that the substrate mounted in the periphery of the semiconductor device 1 does not include a plurality of substrates 2, nor includes a substrate 18 in which a through-hole is formed, but there is employed one insertion substrate 9 in which a cavity (depression) larger in size than the semiconductor device 1 is formed.

In the configuration of the present embodiment, the upper surface of the substrate 9 is one flat surface without any gap; the interposer substrate 3 is pasted onto this surface in this configuration. Hence, with respect to at least a part pasted on the upper surface of the substrate 9, the problem of damage of the wiring pattern 6 dose not easily occur.

The gap 8 is formed between the outer circumference of the semiconductor device 1 and the inner circumference of the cavity; in an area corresponding to the gap, the metallic film 7 is formed as in the exemplary embodiments described above. Therefore, due to the reinforcing function of the metallic film, damage dose not easily occur in the wiring pattern 6.

Incidentally, also for the exemplary embodiments which will be described below, description will be given of a configuration using the substrate 9 including a cavity; however, since the effect of the function of the cavity is similar to that described above, duplicated description will be avoided.

Eighth Exemplary Embodiment

FIG. 15 is a cross-sectional view showing a semiconductor package according to an eighth exemplary embodiment of the present invention.

The semiconductor package of FIG. 15 is similar in structure to that shown in FIG. 14, but differs therefrom only in that the interposer substrate 3 is bent only at an end of one of the four sides of the substrates.

Ninth Exemplary Embodiment

FIG. 16 is a cross-sectional view showing a semiconductor package according to a ninth exemplary embodiment of the present invention.

The semiconductor package of FIG. 16 is similar in structure to that shown in FIG. 12, but differs therefrom only in that the substrate mounted in the periphery of the semiconductor device 1 is one substrate 9.

Tenth Exemplary Embodiment

FIG. 17 is a cross-sectional view showing a semiconductor package according to a tenth exemplary embodiment of the present invention.

The semiconductor package of FIG. 17 is similar in structure to that shown in FIG. 16, but differs therefrom only in that the interposer substrate 3 is bent only at an end of one of the four sides of one substrate 9 in which a cavity is formed.

11th Exemplary Embodiment

FIG. 18 is a cross-sectional view showing a semiconductor package according to an 11th exemplary embodiment of the present invention.

The semiconductor package of FIG. 18 is similar in structure to that shown in FIGS. 2 and 3, but differs therefrom only in that the end section of the interposer substrate 3 is not bent, and the substrate 3 is cut off at ends of the substrates 2 and 18.

In the configuration of this semiconductor package, the interposer substrate 3 is disposed only on one surface of the semiconductor device 1; this package hence differs from the semiconductor packages of the exemplary embodiments described above, namely, it is not possible to laminate packages with each other; however, since the process to bend the interposer substrate 3 is not required, there can be implemented a package lower in cost than that of the first exemplary embodiment.

As above, also in the semiconductor package with a different basic configuration, the effect of the function due to the arrangement of the metallic film 7 in the area corresponding to the gap 8 (that is, the reinforcing effect of the wiring pattern 6) can be attained as in the exemplary embodiment described above.

12th Exemplary Embodiment

FIG. 19 is a cross-sectional view showing a semiconductor package according to a 12th exemplary embodiment of the present invention.

The semiconductor package of FIG. 19 is similar in structure to that shown in FIG. 18, but differs therefrom only in that the metallic film 7 is formed on both surfaces of the wiring pattern 6.

13th Exemplary Embodiment

FIG. 20 is a cross-sectional view showing a semiconductor package according to a 13th exemplary embodiment of the present invention.

The semiconductor package of FIG. 20 is similar in structure to that shown in FIG. 18, but differs therefrom only in that the substrate mounted in the periphery of the semiconductor device 1 does not include a plurality of substrates 2, nor includes a substrate 18 in which a through-hole is formed, but there is employed one substrate 9 in which a cavity larger in size than the semiconductor device 1 is formed.

14th Exemplary Embodiment

FIG. 21 is a cross-sectional view showing a semiconductor package according to a 14th exemplary embodiment of the present invention.

The semiconductor package of FIG. 21 is similar in structure to that shown in FIG. 20, but differs therefrom only in that the metallic film 7 is formed on both surfaces of the wiring pattern 6. Due to the arrangement of the metallic film 7 on both surfaces of the wiring pattern, the wiring strength is enhanced.

15th Exemplary Embodiment

FIGS. 22 to 24 are cross-sectional views showing a semiconductor package according to a 15th exemplary embodiment of the present invention.

The semiconductor package of FIGS. 22 to 24 is similar in structure to that shown in FIGS. 2 and 3, but differs therefrom only in that while the metallic film 7 is formed in the semiconductor package of FIGS. 2 and 3, metallic projections 12 and/or vias filled with a conductor are formed in areas corresponding to the gaps 8 in the semiconductor package of FIGS. 22 and 24.

The metallic projections 12 may include a material equal to that (e.g., Cu or Al) of the wiring pattern 6. An example of the method of producing the metallic projections 12 may be as follows. That is, first, a conductive basic material (Cu, Al, or the like) larger in thickness (e.g., 25 µm to 50 µm) than the final conductor (e.g., 12 µm) is adopted as the basic material of the wiring pattern; the basic material is half-etched to a predetermined thickness thereof (e.g., 12 µm), excepting the locations to form the metallic projections 12. Resultantly, the remaining sections become metallic projections. Thereafter, on the basic material with the metallic projections 12 formed as above, an insulating material such as polyimide is formed; finally, one layer of conductive basic material (e.g., Cu or Al with a thickness of 12 µm) is pasted thereonto.

In the material of which both surfaces are conductive and in which the metallic projections 12 are formed on one conductive-material side, holes are formed by laser machining or by use of a drill to form vias 13 filled with a conductor to establish connection between two layers by using a sputtering method or a plating method.

The metallic projections 12 or the vias 13 (indicating vias filled with a conductor) are formed, and hence, these structures function as reinforcing members of the wiring pattern. In the present embodiment, the metallic projections 12 or the vias 13 filled with a conductor are formed in a size almost equal to that of the area corresponding to the gap 8. However, if only the metallic projections 12 or the vias 13 filled with a conductor include areas corresponding to the gap 8 (see an area A8 of FIG. 6), these structures may naturally be larger than the areas.

Description will be specifically given of the respective configurations of FIGS. 22 to 24. FIG. 22 shows an example in which the metallic projection 12 and the via 13 are formed in the proximity of the gap 8. That is, the metallic projection 12 is formed on a first side (upper surface side in the drawings) in the direction of thickness of the substrate and the via 13 is formed on an opposite side (lower surface side in the drawings) with the gap 8 therebetween. The arrangement of the metallic projection and the via is not restricted by this structure, but the via 13 can be formed on the upper surface side in the drawings and the metallic projection 12 can be formed on the lower surface side in the drawings. In addition, both thereof may be the metallic projections 12 as shown in FIG. 23, and both thereof may be the vias 13 as shown in FIG. 24. Within a range wherein the metallic projections 12 and the vias 13 are arranged to attain an effect of the function to reinforce the wiring pattern 6, the combination of the metallic projections 12 and the vias 13 described above may be appropriately altered. In this connection, although such description will be avoided for the following exemplary embodiments, it is natural that the combination described above is arbitrarily available.

16th Exemplary Embodiment

FIG. 25 is a cross-sectional view showing a semiconductor package according to a 16th exemplary embodiment of the present invention.

The semiconductor package of FIG. 25 is similar in structure to that shown in FIGS. 22 to 24, but differs therefrom only in that the interposer substrate 3 is bent only at an end of one of the four sides of a rectangle configured by the substrates 2 and 18 (see FIGS. 4 and 5).

17th Exemplary Embodiment

FIGS. 26 to 28 are cross-sectional views showing a semiconductor package according to a 17th exemplary embodiment of the present invention.

The semiconductor package of FIGS. 26 to 28 is similar in structure to that shown in FIGS. 22 to 24, but differs therefrom only in that the metallic film 7 is formed between the metallic projection 12 (or the via 13 filled with a conductor) and the wiring pattern 6. That is, the structure is a combination of the configuration of the metallic film 7 described above and that of the metallic projection 12 (or the via 13) described in the exemplary embodiments above. In the configuration, the wiring pattern is more efficiently reinforced.

Now, description will be briefly given of a method of forming a metallic film 7 (Ni, W, or the like) between the metallic projection 12 (or the via 13 filled with a conductor) and the wiring pattern 6. To produce this structure, a three-layer material of, for example, Cu/Ni/Cu or Cu/W/Cu is first adopted as the basic material of the wiring pattern; the Cu on one side is etched excepting the locations to form the metallic projection 12. Thereafter, on the conductive basic material on the side on which the metallic projection 12 is formed, an insulator material such as polyimide is formed. The processes thereafter are similar to those of the method described in the 15th exemplary embodiment.

In FIGS. 26 to 28, the metallic projection 12 or the via 13 filled with a conductor is formed only in the area corresponding to the gap 8; however, only if the metallic projection 12 or the via 13 filled with a conductor includes the area corresponding to the gap 8, the projection 12 or the via 13 may be arranged to be larger than the configuration of FIGS. 26 to 28. FIG. 26 shows a situation wherein a metallic projection 13 serving functions of the metallic projection 12 or the via is formed on the wiring pattern 6, but the configuration is not restricted by this, but all thereof may be the metallic projections 12 as shown in FIG. 27 or all thereof may be the vias 13 filled with a conductor as shown in FIG. 28.

18th Exemplary Embodiment

FIG. 29 is a cross-sectional view showing a semiconductor package according to an 18th exemplary embodiment of the present invention.

The semiconductor package of FIG. 29 is similar in structure to that shown in FIGS. 26 to 28, but differs therefrom only in that the interposer substrate 3 is bent only at an end of one of the four sides of a rectangle configured by the substrates 2 and 18 (see FIGS. 4 and 5).

19th Exemplary Embodiment

FIG. 30 is a cross-sectional view showing a semiconductor package according to a 19th exemplary embodiment of the present invention.

The semiconductor package of FIG. 30 is similar in structure to that shown in FIGS. 22 to 24, but differs therefrom only in that the substrate mounted in the periphery of the semiconductor device 1 does not include a plurality of substrates 2, nor includes a substrate 18 in which a through-hole is formed, but there is employed one insertion substrate 9 in which a cavity larger in size than the semiconductor device 1 is formed.

Incidentally, also in the exemplary embodiments below, for those using a metallic projection or a via filled with a conductor to reinforce tensile strength of the wiring, description will be given as an example of a configuration in which the metallic projection 12 or the via 13 filled with a conductor are formed as a representative example at a position corresponding to the gap. However, the metallic projection 12 or the via 13 filled with a conductor is not restricted by the exemplary embodiment. That is, the projection 12 or the via 13 may be formed not only in the area corresponding to the gap, but in an area including at least the position.

20th Exemplary Embodiment

FIG. 31 is a cross-sectional view showing a semiconductor package according to a 20th exemplary embodiment of the present invention.

The semiconductor package of FIG. 31 is similar in structure to that shown in FIG. 30, but differs therefrom only in that the interposer substrate 3 is bent only at an end of one of the four sides of the substrate 9.

21st Exemplary Embodiment

FIG. 32 is a cross-sectional view showing a semiconductor package according to a 21st exemplary embodiment of the present invention.

The semiconductor package of FIG. 32 is similar in structure to that shown in FIG. 30, but differs therefrom only in that the metallic film 7 is formed between the metallic projection 12 (or the via filled with a conductor) and the wiring pattern 6.

22nd Exemplary Embodiment

FIG. 33 is a cross-sectional view showing a semiconductor package according to a 22nd exemplary embodiment of the present invention.

The semiconductor package of FIG. 33 is similar in structure to that shown in FIG. 32, but differs therefrom only in that the interposer substrate 3 is bent only at an end of one of the four sides of the substrate 9.

23rd Exemplary Embodiment

FIG. 34 is a cross-sectional view showing a semiconductor package according to a 23rd exemplary embodiment of the present invention.

The semiconductor package of FIG. 34 is similar in structure to that shown in FIG. 18, the but differs therefrom only in that while the metallic film 7 is formed in the configuration of FIG. 18, metallic projections 12 and/or vias 13 filled with a conductor are formed in the vicinity of the gap 8. As above, also in the semiconductor package with a different basic configuration, the effect of the function due to the arrangement of the metallic projections 12 and/or vias 13 can be attained as in the exemplary embodiments described above.

24th Exemplary Embodiment

FIG. 35 is a cross-sectional view showing a semiconductor package according to a 24th exemplary embodiment of the present invention.

The semiconductor package of FIG. 35 is similar in structure to that shown in FIG. 34, but differs therefrom only in that the metallic film 7 is formed between the metallic projection 12 (or the via filled with a conductor) and the wiring pattern 6. As a result, the strength of the wiring is further increased when compared with the structure of the 23rd exemplary embodiment.

25th Exemplary Embodiment

FIG. 36 is a cross-sectional view showing a semiconductor package according to a 25th exemplary embodiment of the present invention.

The semiconductor package of FIG. 36 is similar in structure to that shown in FIG. 34, but differs therefrom only in that the substrate mounted in the periphery of the semiconductor device 1 does not include a plurality of substrates 2, nor includes a substrate 18 in which a through-hole is formed, but there is employed one insertion substrate 9 in which a cavity larger in size than the semiconductor device 1 is formed.

26th Exemplary Embodiment

FIG. 37 is a cross-sectional view showing a semiconductor package according to a 26th exemplary embodiment of the present invention.

The semiconductor package of FIG. 37 is similar in structure to that shown in FIG. 36, but differs therefrom only in that the metallic film 7 is formed between the metallic projection 12 (or the via filled with a conductor) and the wiring pattern 6. As a result, the strength of the wiring is further increased when compared with the structure of the 25th exemplary embodiment.

27th Exemplary Embodiment

FIG. 38 is a cross-sectional view showing a semiconductor package according to a 27th exemplary embodiment of the present invention.

The semiconductor package of FIG. 38 is similar in structure to that shown in FIGS. 2 and 3, but differs therefrom only in that a passive element 14 such as a capacitor, a resistor, or an inductor is mounted between the substrate 9 and the interposer substrate 3.

Incidentally, in a situation wherein the semiconductor device 1 is, for example, an LSI such as a CPU operating at a high speed, a decoupling capacitor is mounted in the periphery of the CPU in general. An area occupied by the decoupling capacitor hinders the downsizing of the apparatus.

In contrast thereto, by arranging the decoupling capacitor as the passive element 14 between the substrates 2 and 18 and the interposer substrate 3 as in the present embodiment, the apparatus is downsized. Incidentally, in the production method in this case, a passive element 14 (e.g., a thin-film passive element) is first formed on the substrates 2 and 18. As a specific method to produce the thin-film passive element 14, there exists, for example, a sputtering method, a sol-gel method, or a plating method. By using these methods, the passive element can be directly formed as a film on the substrates. Alternatively, there may also be employed a method in which an element beforehand produced and cut off in a piece is pasted on the substrates 2 and 18 (may be fixed using, for example, an adhesive).

It is designed in the configuration that the thickness of the semiconductor device 1 is equal to the total of thicknesses of the substrates 2 and 18 and the passive element 14. Conductive bumps such as Au stud bumps are mounted on electrodes, not shown, of the thin-film passive element 14 to be then connected to solder such as Au or SnAg formed on the wiring pattern of the interposer substrate 3.

Incidentally, FIG. 38 shows an example using the substrates 2 and 18; however, it is also possible to use, in place thereof, a substrate 9 including a cavity formed with a depth in which the semiconductor device 1 can be mounted.

28th Exemplary Embodiment

FIG. 39 is a cross-sectional view showing a semiconductor package according to a 28th exemplary embodiment of the present invention.

The semiconductor package of FIG. 39 is similar in structure to that shown in FIG. 38, but differs therefrom only in that the interposer substrate 3 is bent only at an end of one of the four sides of a rectangle configured by the substrates 2 and 18 (see FIGS. 4 and 5).

29th Exemplary Embodiment

FIG. 40 is a cross-sectional view showing a semiconductor package according to a 29th exemplary embodiment of the present invention.

The semiconductor package of FIG. 40 is similar in structure to that shown in FIG. 38, but differs therefrom only in that the metallic film 7 is formed on both sides of the wiring pattern 6. Since the film 7 is formed on both sides of the wiring pattern, the strength of the wiring is further increased.

30th Exemplary Embodiment

FIG. 41 is a cross-sectional view showing a semiconductor package according to a 30th exemplary embodiment of the present invention.

The semiconductor package of FIG. 41 is similar in structure to that shown in FIG. 40, but differs therefrom only in that the interposer substrate 3 is bent only at an end of one of the four sides of a rectangle configured by the substrates 2 and 18 (see FIGS. 4 and 5).

31st Exemplary Embodiment

FIG. 42 is a cross-sectional view showing a semiconductor package according to a 31st exemplary embodiment of the present invention.

The semiconductor package of FIG. 42 is similar in structure to that shown in FIG. 18, but differs therefrom only in that a passive element 14 such as a capacitor, a resistor, or an inductor is mounted between the substrate 2 and 8 and the interposer substrate 3. The advantage due to the mounting of the passive element 14 is similar to that of the 27th exemplary embodiment (see FIG. 38).

32nd Exemplary Embodiment

FIG. 43 is a cross-sectional view showing a semiconductor package according to a 32nd exemplary embodiment of the present invention.

The semiconductor package of FIG. 43 is similar in structure to that shown in FIG. 42, but differs therefrom only in that the metallic film 7 is formed on both sides of the wiring pattern 6. Since the film 7 with higher tensile strength is formed on both sides of the wiring pattern, the strength of the wiring is further increased.

33rd Exemplary Embodiment

FIG. 44 is a cross-sectional view showing a semiconductor package according to a 33rd exemplary embodiment of the present invention.

The semiconductor package of FIG. 44 is similar in structure to that shown in FIG. 38, but differs therefrom only in that the exemplary embodiment 33 uses a conductor 9' in which several cavities with a depth in which the semiconductor device 1 and the passive element can be mounted are formed. Due to the structure of this kind, there does not occur the disadvantage in which the package becomes thicker by the thickness of the passive element 14.

34th Exemplary Embodiment

FIG. 45 is a cross-sectional view showing a semiconductor package according to a 34th exemplary embodiment of the present invention.

The semiconductor package of FIG. 45 is similar in structure to that shown in FIG. 44, but differs therefrom only in that the interposer substrate 3 is bent only at an end of one of the four sides of the substrate 9'.

35th Exemplary Embodiment

FIG. 46 is a cross-sectional view showing a semiconductor package according to a 35th exemplary embodiment of the present invention.

The semiconductor package of FIG. 46 is similar in structure to that shown in FIG. 44, but differs therefrom only in that the metallic film 7 is formed on both sides of the wiring pattern 6. Since the film 7 is formed on both sides of the wiring pattern, the strength of the wiring is further increased.

36th Exemplary Embodiment

FIG. 47 is a cross-sectional view showing a semiconductor package according to a 36th exemplary embodiment of the present invention.

The semiconductor package of FIG. 47 is similar in structure to that shown in FIG. 46, but differs therefrom only in that the interposer substrate 3 is bent only at an end of one of the four sides of the substrate 9'.

37th Exemplary Embodiment

FIG. 48 is a cross-sectional view showing a semiconductor package according to a 37th exemplary embodiment of the present invention.

The semiconductor package of FIG. 48 is similar in structure to that shown in FIG. 42, but differs therefrom only in that there is used a substrate 9" in which cavities with a depth in which only the semiconductor device 1 can be mounted are formed (a through-hole is formed at a location at which the semiconductor device 1 is mounted).

38th Exemplary Embodiment

FIG. 49 is a cross-sectional view showing a semiconductor package according to a 38th exemplary embodiment of the present invention.

The semiconductor package of FIG. 49 is similar in structure to that shown in FIG. 48, but differs therefrom only in that the metallic film 7 is formed on both sides of the wiring pattern 6. Since the film 7 is formed on both sides of the wiring pattern, the strength of the wiring is further increased.

39th Exemplary Embodiment

FIG. 50 is a cross-sectional view showing a semiconductor package according to a 39th exemplary embodiment of the present invention.

The semiconductor package of FIG. 50 is similar in structure to that shown in FIG. 44, but differs therefrom only in that while the metallic film 7 is formed as means to increase the wiring strength of the wiring pattern 6, there are formed, in place thereof, metallic projections 12 or vias 13 filled with a conductor on the wiring pattern 6.

40th Exemplary Embodiment

FIG. 51 is a cross-sectional view showing a semiconductor package according to a 40th exemplary embodiment of the present invention.

The semiconductor package of FIG. 51 is similar in structure to that shown in FIG. 50, but differs therefrom only in that the interposer substrate 3 is bent only at an end of one of the four sides of the substrate 9'.

41st Exemplary Embodiment

FIG. 52 is a cross-sectional view showing a semiconductor package according to a 41st exemplary embodiment of the present invention.

The semiconductor package of FIG. 52 is similar in structure to that shown in FIG. 50, but differs therefrom only in that the metallic film 7 is formed between the metallic projections 12 (or the vias 13 filled with a conductor) and the wiring pattern 6; the strength of the wiring pattern placed in the vicinity of the gap 8 is increased as compared with the 39th exemplary embodiment example.

42nd Exemplary Embodiment

FIG. 53 is a cross-sectional view showing a semiconductor package according to a 42nd exemplary embodiment of the present invention.

The semiconductor package of FIG. 53 is similar in structure to that shown in FIG. 52, but differs therefrom only in that the interposer substrate 3 is bent only at an end of one of the four sides of the substrate 9'.

43rd Exemplary Embodiment

FIG. 54 is a cross-sectional view showing a semiconductor package according to a 43rd exemplary embodiment of the present invention.

The semiconductor package of FIG. 54 is similar in structure to that shown in FIG. 48, but differs therefrom in that instead of employing the means of forming the metallic film 7, there are formed metallic projections 12 or vias 13 filled with a conductor on the wiring pattern 6 placed in the proximity of the gap 8.

44th Exemplary Embodiment

FIG. 55 is a cross-sectional view showing a semiconductor package according to a 44th exemplary embodiment of the present invention.

The semiconductor package of FIG. 55 is similar in structure to that shown in FIG. 54, but differs therefrom only in that the metallic film 7 is formed between the metallic projection 12 (or the vias 13 filled with a conductor) and the wiring pattern 6; the strength of the wiring pattern placed in the vicinity of the gap 8 is increased as compared with the 43rd exemplary embodiment.

45th Exemplary Embodiment

FIG. 56 is a cross-sectional view showing a semiconductor package according to a 45th exemplary embodiment of the present invention.

The semiconductor package shown in FIG. 56 is a semiconductor package in which two semiconductor packages shown in FIGS. 2 and 3 (the respective packages include different types of semiconductor devices 1) are laminated with each other in a three-dimensional fashion.

The semiconductor package of exemplary embodiment 1 includes external electrodes on both surfaces of the package and hence can be laminated as above. Although FIG. 56 shows an example in which two packages are laminated, the number of packages are not limited to two, but there naturally exists an example in which two or more packages are laminated. Also, FIG. 56 shows a three-dimensional package in which the semiconductor devices 1 of different types are combined with each other; however, there naturally exists an example in which semiconductor devices of the same type are combined with each other.

46th Exemplary Embodiment

FIG. 57 is a cross-sectional view showing a semiconductor package according to a 46th exemplary embodiment of the present invention.

The semiconductor package of FIG. 57 is a lamination-type semiconductor package in which the semiconductor packages shown in FIGS. 2 and 3 and the semiconductor package shown in FIG. 11 laminated with each other in a three-dimensional fashion.

In this regard, although FIG. 57 shows an example in which two packages are laminated, the number of packages is not limited to two, but there naturally exists an example in which two or more packages are laminated.

47th Exemplary Embodiment

FIG. 58 is a cross-sectional view showing a semiconductor package according to a 47th exemplary embodiment of the present invention.

The semiconductor package of FIG. 58 is a package in which the semiconductor package shown in FIG. 34, that shown in FIG. 50, and that shown in FIG. 10 are laminated with each other in a three-dimensional fashion.

In FIG. 58, the packages of the 23rd, 27th, and 39th exemplary embodiments are selected from those described above and are laminated in a three-dimensional fashion. Incidentally, there naturally exists an example in which configurations associated with a plurality of exemplary embodiments are appropriately selected from the first to 44th exemplary embodiments and are freely laminated in three-dimensional fashion.

48th Exemplary Embodiment

FIG. 59 is a cross-sectional view showing a semiconductor package according to a 48th exemplary embodiment of the present invention.

The semiconductor package of FIG. 59 is a three-dimensional package in which a package 16 (e.g., a known package of the related art) with a configuration other than those of the present invention is laminated on the semiconductor packages shown in FIGS. 2 and 3. In this manner, the semiconductor packages in accordance with the present invention may be used in combination with, for example, a known package 16 of the related art.

In this regard, although FIG. 59 shows a configuration including a combination of the semiconductor packages of FIGS. 2 and the package 16, the present invention is not restricted by the configuration. There may be used, in place of the first exemplary embodiment, one or a plurality of semiconductor packages selected from the second to 44th exemplary embodiments. Moreover, this also applies to the exemplary embodiments below.

49th Exemplary Embodiment

FIG. 60 is a cross-sectional view showing a semiconductor package according to a 49th exemplary embodiment of the present invention.

The semiconductor package of FIG. 60 is almost equal in structure to that shown in FIG. 59. The present package is implemented by laminating a known conventional package on the semiconductor package shown in FIG. 30. Specifically, this structure differs from the structures of the present invention only in that the substrates 2, 9, and 18 are removed and there is laminated a package implementing a fan-in structure. This structure has a feature that the 49th exemplary embodiment can be thinner than the 48th exemplary embodiment.

50th Exemplary Embodiment

FIG. 61 is a cross-sectional view showing a semiconductor package according to a 50th exemplary embodiment of the present invention.

The semiconductor package of FIG. 61 is almost equal in structure to that shown in FIG. 59. The semiconductor package is a three-dimensional package in which a package 16 with a configuration other than that of the present invention is laminated on the semiconductor package (27th exemplary embodiment) which is shown in FIG. 38 and which includes a built-in passive element (a capacitor, a resistor, or a via) 14.

51st Exemplary Embodiment

FIG. 62 is a cross-sectional view showing a semiconductor package according to a 51st exemplary embodiment of the present invention.

The semiconductor package of FIG. 62 is similar in structure to that shown in FIG. 59 and that shown in FIG. 60, but differs therefrom only in that two kinds of packages 16 with a configuration other than that of the present invention are mounted on the semiconductor package of the present invention (the semiconductor package of FIG. 14 in FIG. 60).

In a situation wherein two kinds of packages 16 with a configuration other than that of the present invention are mounted on the semiconductor package of the present invention, it is rather favorable as shown in FIG. 62 that each kind of package 16 is mounted on the interposer substrate 3 bent at an end of each of the mutually different sides from the four sides of the rectangle of the substrate 9 since the wiring design restriction is mitigated for the interposer substrate 3 of the present invention.

The exemplary embodiments described above are examples in which the interposer substrate 3 is flip-chip connected via the conductor bump 5 to the semiconductor device 1. However, it goes without saying that there exists an example in which the semiconductor device 1 is connected to the interposer substrate 3 by use of other means such as wire bonding employing an Au wire. Moreover, the present invention is not restricted by the above configurations unless the scope thereof is exceeded.

EXAMPLES

Next, referring to drawings, description will be given of the present invention further in detail on the basis of exemplary embodiment examples of the present invention; however, the present invention is not restricted by the following examples unless the scope thereof is exceeded.

Example 1

Referring to FIG. 3, description will be given of example 1 of the present invention.

One chip of logic LSI is employed as the semiconductor device 1. The logic LSI has outer dimensions of 7 mm×7 mm and 300 pins for input/output terminals. The LSI is polished to a thickness of 100 μm, and Au stud bumps are formed for the input/output terminals of the LSI chip.

In the interposer substrate 3, a 12 μm thick Cu foil pattern 6 is formed on both surfaces of 25 μm thick polyimide, and the patterns are interconnected by use of a via 11. The via 11 can be configured by using laser machining, sputtering, electrolytic Cu plating, and the like. Onto each of the Cu foil patterns 6, thermoplastic polyimide 10 is pasted.

The method of producing the interposer substrate 3 may be specifically as below. That is, the Cu foil pattern 6 is first formed on both surfaces of a basic material (corresponding to the layer of "polyimide" described above) using a subtractive method (or a semi-additive method). Next, only onto a surface (a surface for the outer side) on which the solder bump 4 is to be mounted, a 25 μm thick thermoplastic polyimide sheet is pasted by a vacuum press method. Thereafter, in the thermoplastic polyimide, a hole to mount the solder bump 4 therein is formed by use of a carbon oxide gas laser.

Next, after conducting a de-smearing process using a solution of potassium permanganate, a Ni (2 μm)/Au (0.5 μm) film is formed on the overall surface at locations where Cu is exposed in both surfaces of the basic material (an image of the Ni/Au plating formed on the electrode pad 17 is not shown in FIG. 3). Finally, for the interposer substrate 3, a 25 μm thick thermoplastic polyimide sheet is pasted onto the surface to be connected to the logic LSI using a vacuum press method.

For the substrate 18, there is employed a 100 μm thick Cu piece with external dimensions of 13 mm×13 mm in which a through-hole with an inner diameter of 7.1 mm is formed at a central section. The Cu plate in which the through-hole is formed is produced by an ordinary etching process.

Next, description will be given of a method of assembling the semiconductor package. First, a logic LSI chip is installed on the interposer substrate 3 by use of an ultrasonic flip-chip mounter. More concretely, in a state in which the interposer substrate 3 is fixed by vacuum adsorption on a flip-chip mounter heated up to a range from 150° C. to 180° C., a positioning process is conducted using a camera and then the logic LSI chip is mounted. In this fashion, by heating the interposer substrate, the thermoplastic polyimide softens. Therefore, without disposing a hole in the thermoplastic polyimide by a laser or the like in advance, the Au stud bump formed on the logic LSI chip pierces through the thermoplastic polyimide such that Au—Au metallic junction is established between an bump and an Ni/Au plate film (Au film for the junction) on the wiring pattern 6. In this process, the Au—Au junction and the sealing by the thermoplastic polyimide in the periphery of the Au bump are simultaneously and totally carried out.

Next, the substrate 18 in which the through-hole is beforehand arranged is fixed onto the interposer substrate 3 such that the logic LSI chip is placed in the area of the through-hole. In this connection, this process is executable using the flip-chip mount as described above.

When the substrate 18 is mounted on the interposer substrate 3 in this fashion, the interposer substrate 3 is then bent at an end of two opposing sides of the substrate 18, and the bent sections are pushed against the substrate surface to be fixed thereonto. Precisely, the bent sections are handled using a dedicated bending device (jig); and the bending is accomplished by heating the interposer substrate 3 to a predetermined temperature (for example, in a range from 150° C. to 200° C.).

Subsequently, the substrate 3 and the like are fully cooled down, the electrode pad 17 is coated with flux, and solder 4 of Sn, Ag, and Cu with a diameter of 0.3 mm is mounted thereon. As the solder, there may be employed solder of any composition such as solder of SnPb and SnZn. After the solder is mounted, the work piece is placed in a reflow furnace to form the solder bump 4 on the semiconductor package; thereafter, the flux is cleaned by organic solvent to attain the semiconductor package as shown in FIG. 3.

For the semiconductor package thus obtained, a temperature cycle test is conducted for −65° C. (10 min) to 150° C. (10 min). As reference, a test is similarly carried out for the conventional semiconductor package shown in FIG. 1.

As a result of the tests, for the conventional semiconductor package, a fault of line disconnection occurs in the interposer substrate 3 at 100 cycles to 200 cycles. In contrast thereto, for the semiconductor package of the present invention, it is confirmed that no fault of line disconnection occurs in the interposer substrate 3 up to 1000 cycles; there is obtained a highly reliable semiconductor package.

Example 2

Referring to FIG. 12, description will be given of example 2 of the present invention. For the semiconductor device 1, there is employed the same logic LSI as that of example 1. Also for the insertion substrate, there is adopted a Cu plate 18 in which the same through-hole as that of example 1 is formed.

Example 2 (FIG. 12) differs in structure from example 1 (FIG. 3) in that the metallic film 7 is formed on the overall portions of both surfaces of the wiring pattern 6.

In the method of producing the interposer substrate 3, a three-layer material of Cu (12 μm)/Ni (2 μm)/polyimide (25 μm) is utilized as the basic material to form the wiring pattern on the side of connection to the semiconductor device 1. A via is formed at a predetermined position by a carbon oxide gas laser; after a de-smearing process, a Cu film is formed thereon including the inside of the via by sputtering and electrolytic plating to obtain a four-layer material of Cu (12 μm)/Ni (2 μm)/polyimide (25 μm)/Cu (12 μm), and then patterning is conducted on both surfaces of the Cu foil. After this point, the same processes as for example 1 are conducted to complete the interposer substrate 3.

By use of the interposer substrate 3 described above, there is produced the semiconductor package as shown in FIG. 12; the package assembly method is similar to that of example 1.

In the semiconductor package of example 2 produced as above, the wiring strength of the interposer substrate 3 is further increased as compared with example 1, and there is implemented a semiconductor package with higher reliability.

Example 3

Referring to FIG. 23, description will be given of example 3 of the present invention. For the semiconductor device 1, there is employed the same logic LSI as that of example 1.

Also for the insertion substrate, there is adopted a Cu plate 18 in which the same through-hole as that of example 1 is arranged.

In the method of producing the interposer substrate 3, a 35 μm thick Cu foil is adopted as the material of the Cu wiring pattern. The Cu foil is half-etched until its thickness becomes 12 μm such that there remains an area for the metallic projection (100 μm long diameter). As a result, there is attained a basic material of Cu (12 μm)/Cu projection (projection height=23 μm).

For the place to form the Cu projection 12, the projection is formed on the Cu wiring pattern 6 in all the areas corresponding to the gap 8 (the interval therebetween ranges from 20 μm to 30 μm) as shown in FIGS. 22 to 24. Concretely, the Cu projection 12 is formed such that the center of the projection 12 matches that of the gap 8. In this configuration, the diameter of the Cu projection 12 is a diameter of ø100 μm as described above and the interval between the gaps 8 ranges from 20 μm to 30 μm; and hence the Cu projection 12 covers the gap 8 in the configuration.

The basic material in which the Cu projections 12 are formed is coated with thermoplastic polyimide with a thickness of 25 μm, using a casting method. Next, a 12 μm thick Cu foil is fixed onto the basic material by thermal pressing. As a result, there is produced a material with a Cu foil on both surfaces in which 23 μm high Cu projections with a diameter of 100 μm are formed on one conductive basic material side.

Next, a hole is arranged in the polyimide at predetermined positions (locations of the gaps 8) by a carbon oxide gas laser; after a de-smearing process is conducted, a via 13 filled with Cu is formed to establish connection between two layers by sputtering and electrolytic plating; after a pattern is formed on both surfaces of the Cu foil, the same processes as those of example 1 are conducted to complete the interposer substrate 3.

By use of the interposer substrate 3 described above, there is produced the semiconductor package as shown in FIG. 23; the package assembly method is similar to that of example 1.

In the semiconductor package of example 3 produced as above, the wiring strength of the interposer substrate 3 is increased as in example 1, and there is implemented a semiconductor package with high reliability.

Example 4

Referring to FIG. 27, description will be given of example 4 of the present invention. The semiconductor package of FIG. 27 is similar in structure to that shown in FIG. 23, but differs therefrom only in that the metallic film 7 is formed between the metallic projection 12 and the wiring pattern 6. For the semiconductor device 1, there is employed the same logic LSI as that of example 1; also for the substrate, there is adopted a Cu plate 18 in which the same through-hole as that of example 1 is formed.

In the method of producing the interposer substrate 3, a three-layer material of Cu (12 μm)/Ni (2 μm)/Cu (25 μm) is used as the basic material to form the wiring pattern. The material is etched such that the Cu remains at locations where the metallic projection 12 is formed on the 25 μm thickness side, and then the basic material on the side on which the metallic projection 12 is formed is coated with thermoplastic polyimide by use of a casting method; thereafter, the interposer substrate 3 is produced through processes similar to those described for example 3.

By use of the interposer substrate 3 described above, there is produced the semiconductor package as shown in FIG. 27; the package assembly method is similar to that of example 1.

In the semiconductor package of example 4 produced as above, the wiring strength of the interposer substrate 3 is increased as compared with examples 1 and 3, and there is implemented a semiconductor package with higher reliability.

Example 5

Referring to FIG. 38, description will be given of example 5 of the present invention. The semiconductor package of FIG. 38 has a feature that a passive element 14 is added to the semiconductor package shown in FIG. 3.

For the semiconductor device 1, there is employed a 150 μm thick CPU (Central Processing Unit) with an operation frequency of 2 GHz. For the insertion substrate 18, there is adopted a member which is made of a 130 μm thick alumina sheet and in which a through-hole (a hole including an area in which the CPU can be installed) is arranged in the central section by machining.

On the surface of the alumina substrate 18, a material of the passive element 14 (a capacitor, a resistor, and an inductor) is printed using a screen printing method and is then sintered to form an element (with a thickness of 20 μm). The capacitor is produced by using Ag paste for the conductor section and dielectric glass paste for the dielectric layer. The resistor is produced using $RuO_2$ paste. The inductor is produced by use of Ag paste. As the conductor paste, there may be employed, in addition to the Ag paste, paste of Au, Cu, Ag—Pt, Ag—Pd, or the like. After the passive element 14 is formed on the alumina plate, Ni/Au by electroless plating is carried out for the terminal section of each element to thereby form an Au stud bump.

Using the alumina substrate 18 attained as above, in which the passive element 14 is formed, the interposer substrate 3 described in example 1 is connected via the Au stud bump 5 to the passive element 14 as in the semiconductor device 1 (logic LSI); thereafter, the interposer substrate including the built-in passive element 14 is produced using an assembly method similar to that of the examples described above.

In the package of example 5 thus produced, the wiring strength is increased as in example 1, and there is implemented not only a highly reliable package, but it is possible to install, in the package, the passive element which is inherently mounted in the periphery of the CPU package, and hence there is implemented a semiconductor package allowing high-density installation.

Example 6

Referring to FIG. 56, description will be given of example 6 of the present invention. Example 6 is an example of a three-dimensional mount package in which two semiconductor packages of the present invention (the packages with the structure of example 1 in FIG. 56) are laminated with each other.

For the semiconductor device 1 of the upper section shown in FIG. 56, a memory (DRAM) with outer dimensions of 10 mm×8 mm is employed; for the semiconductor device 1 on the lower section, a 7 mm×7 mm DSP (Digital Signal Processor) is adopted.

The method of assembling the semiconductor packages respectively on the upper and lower sections is the same as that of example 1. For the method of laminating the semiconductor packages onto each other, after the upper-section semiconductor package is fixed by vacuum adsorption on a stage of the flip-chip mounter with the rear side of the chip facing downward, the solder bump 4 of the upper-section semiconductor package is coated with flux. Next, after aligning, by a camera of the flip-chip mounter, the center of the electrode pad 17 on the rear side of the lower-stage semiconductor package to the center of the solder bump 4 of the upper-section semiconductor package, both packages are provisionally fixed onto each other by flux of the flip-chip mounter without heating the flux. Thereafter, the two semiconductor packages thus provisionally attached onto each other are placed in a reflow furnace to melt solder to thereby connect the two semiconductor packages to each other.

As above, there is produced a System in Package (SiP) in which the DRAM and the DSP are laminated onto each other. In such SiP, since the strength of the wiring of each semiconductor package is increased, there can be implemented a highly reliable package also in the configuration of a three-dimensional mount package. By mounting such SiP in an electronic apparatus, e.g., a cellular or a digital camera, it is possible to downsize the electronic apparatus.

Additionally, when a three-dimensional mount package in which two semiconductor packages using the DRAM adopted in the present example are laminated to double the storage capacity is mounted in a memory module installed in electronic apparatuses such as a personal computer, a server, and a workstation, it is possible to increase the storage capacity of these electronic apparatuses and to enhance the performance thereof.

Example 7

Referring to FIG. 59, description will be given of example 7 of the present invention.

Example 7 is implemented by laminating, onto the semiconductor device 1 using the DSP described for example 6, a conventional DRAM package available in the market (the DRAM is connected to the interposer substrate using a method such as wire bonding or TAB connection, and then the entire item is sealed by mold resin). The method of laminating two semiconductor packages is similar to that described for example 6.

According to the semiconductor package of example 7, by adopting an insertion substrate of Cu (17 ppm) with a coefficient of linear expansion almost equal to that (about 15 ppm) of the conventional package sealed by mold resin, it is possible to attain a three-dimensional mount package with highly reliable connecting locations of the semiconductor bumps 4 establishing connection between two packages.

As above, description has been given of examples of the present invention in various ways; however, the present invention is not restricted by the examples, but it is needless to say that the examples may be modified in various fashions without departing from the spirit of the present invention.

DESCRIPTION OF REFERENCE NUMERALS

Figure 1:
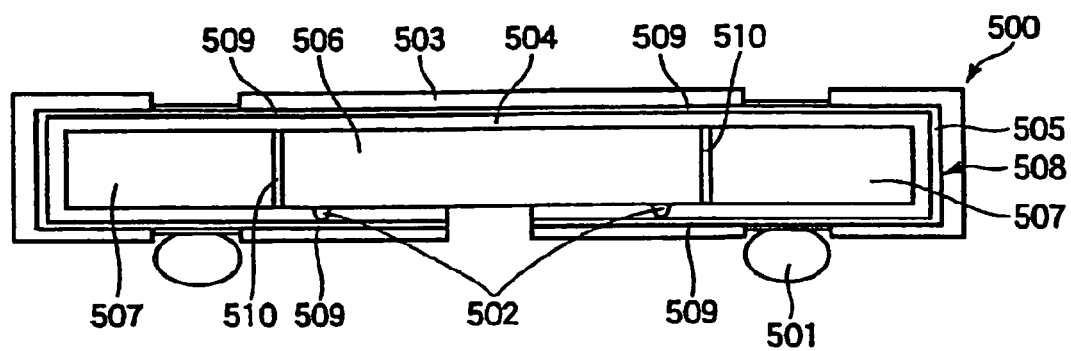
[FIG. 1] is a cross-sectional view showing structure of a conventional semiconductor package.
Figure 2:
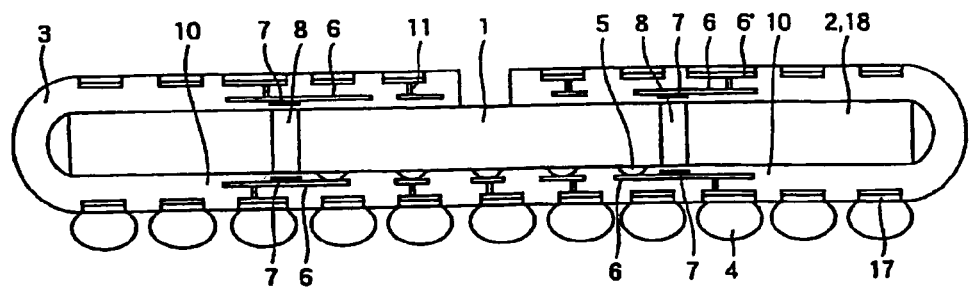
[FIG. 2] is a cross-sectional view showing a semiconductor package in a first exemplary embodiment of the present invention.
Figure 3:
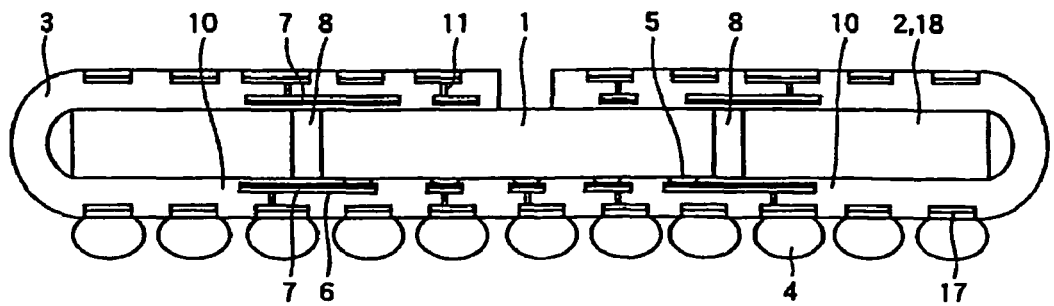
[FIG. 3] is a cross-sectional view showing a semiconductor package in a first exemplary embodiment of the present invention.
Figure 4:
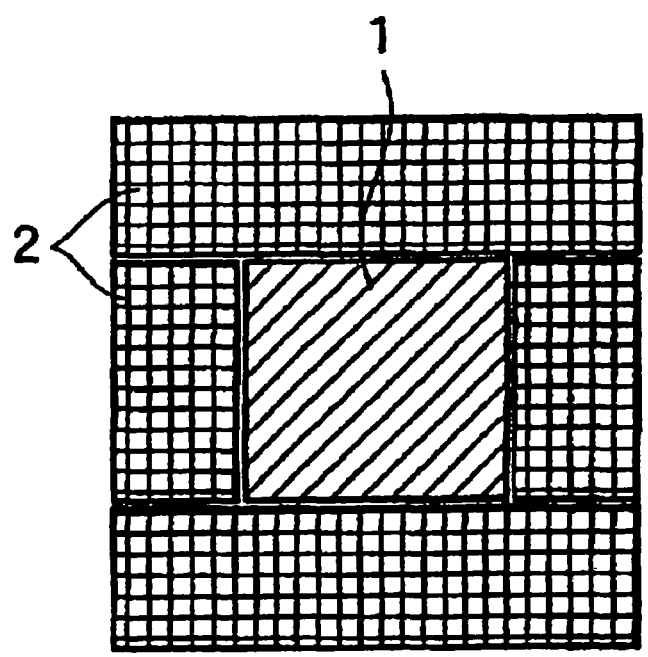
[FIG. 4] is a top view of a semiconductor package (an interposer substrate is not shown).
Figure 5:
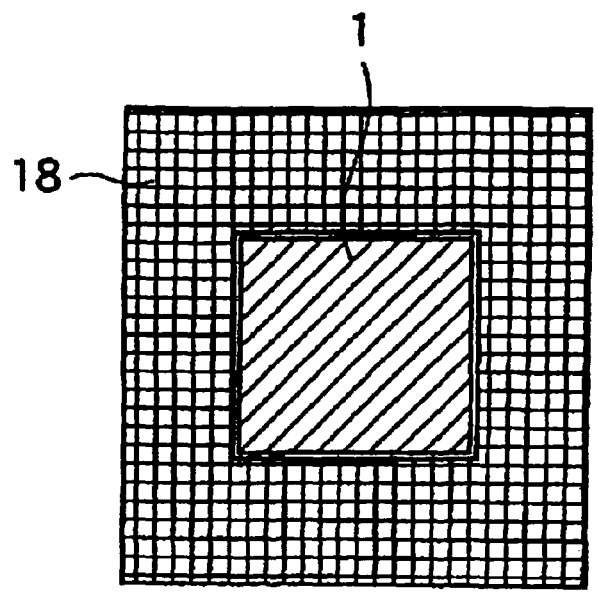
[FIG. 5] is a top view of a semiconductor package (an interposer substrate is not shown).
Figure 6:
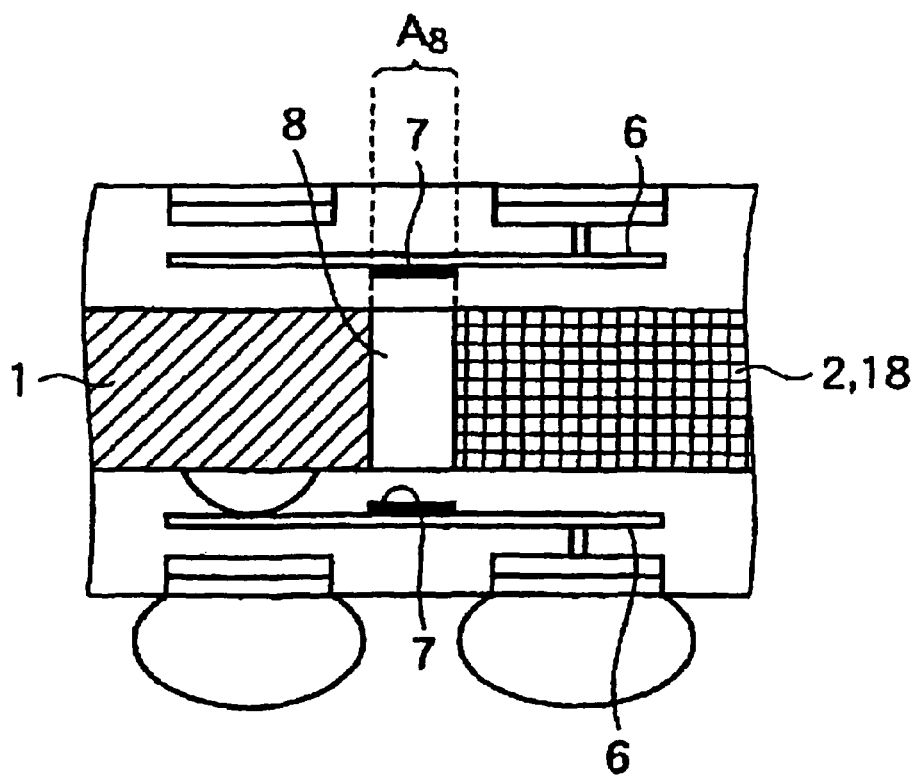
[FIG. 6] is a cross-sectional view to explain an area corresponding to a gap.
Figure 7:
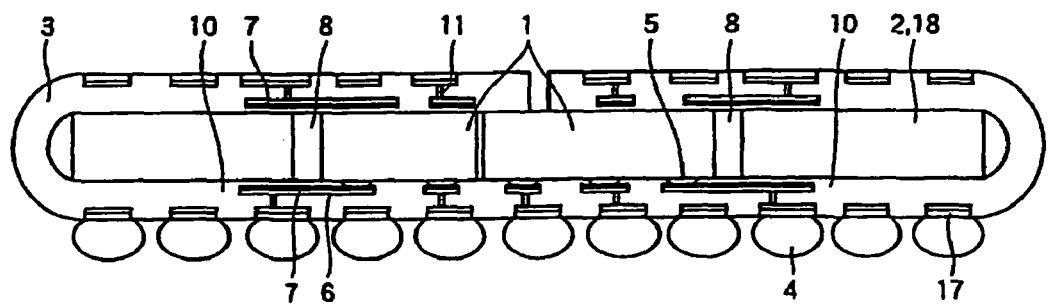
[FIG. 7] is a cross-sectional view showing a semiconductor package in a second exemplary embodiment of the present invention.
Figure 8:
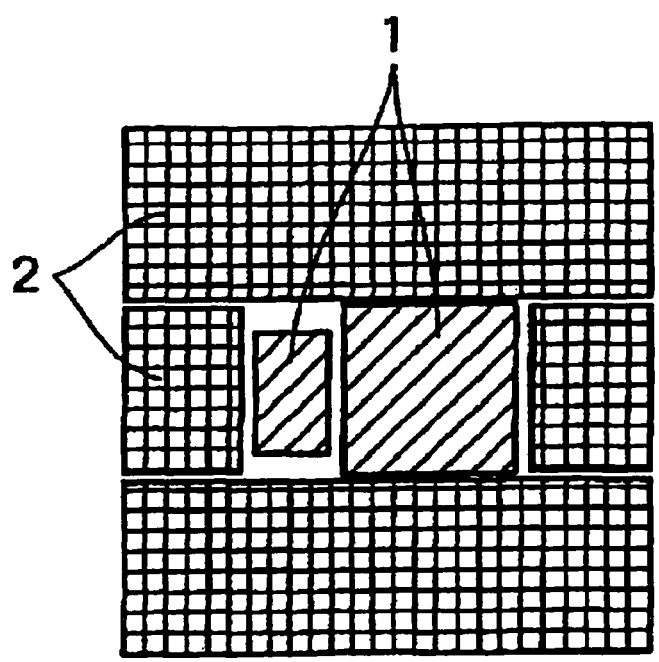
[FIG. 8] is a top view of a semiconductor package (an interposer substrate is not shown).
Figure 9:
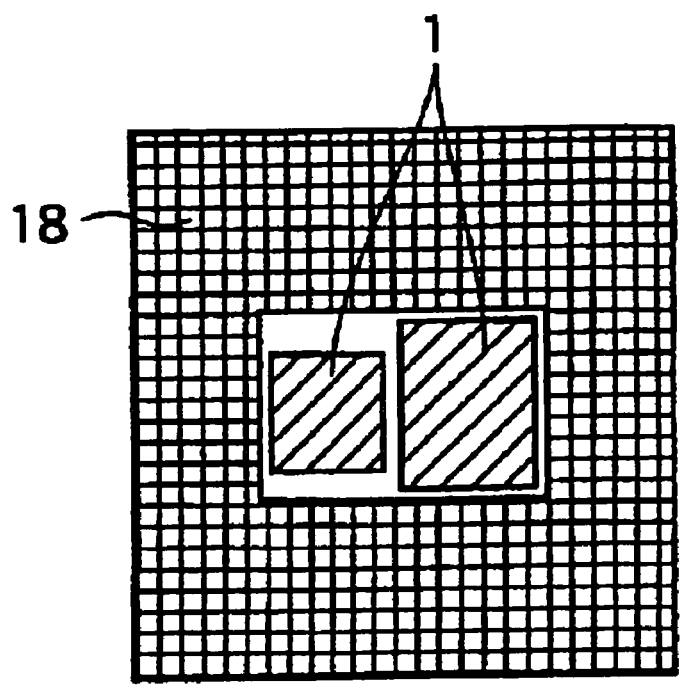
[FIG. 9] is a top view of a semiconductor package (an interposer substrate is not shown).
Figure 10:
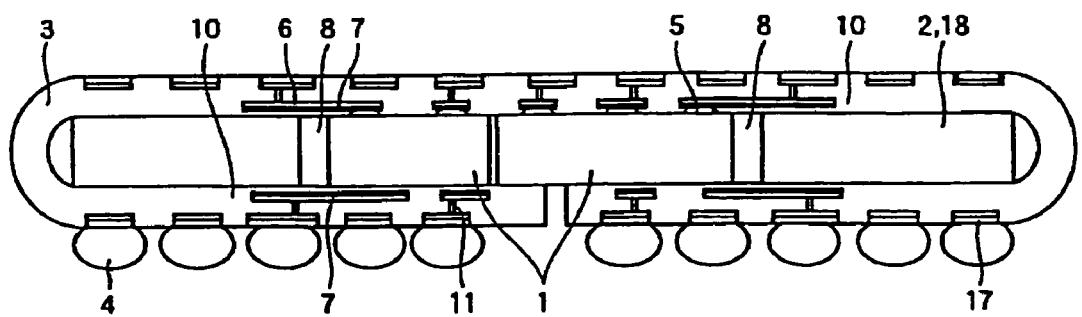
[FIG. 10] is a cross-sectional view showing a semiconductor package in a third exemplary embodiment of the present invention.
Figure 11:
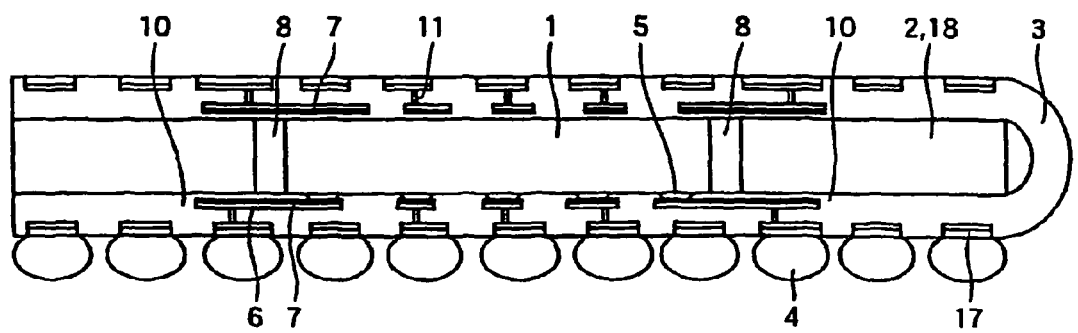
[FIG. 11] is a cross-sectional view showing a semiconductor package in a fourth exemplary embodiment of the present invention.
Figure 12:
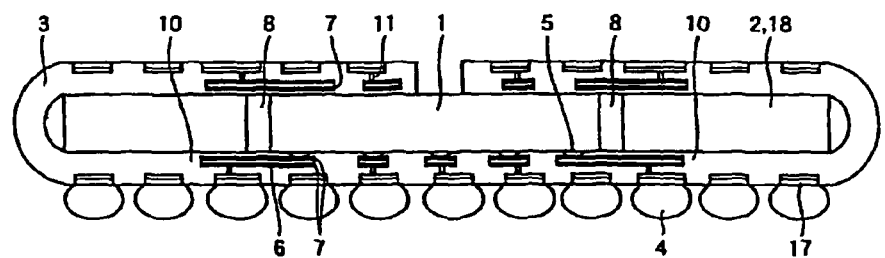
[FIG. 12] is a cross-sectional view showing a semiconductor package in a fifth exemplary embodiment of the present invention.
Figure 13:
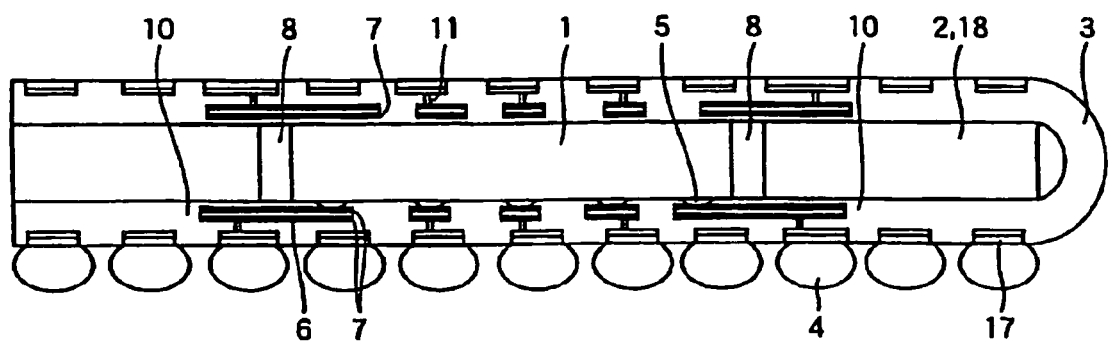
[FIG. 13] is a cross-sectional view showing a semiconductor package in a sixth exemplary embodiment of the present invention.
Figure 14:
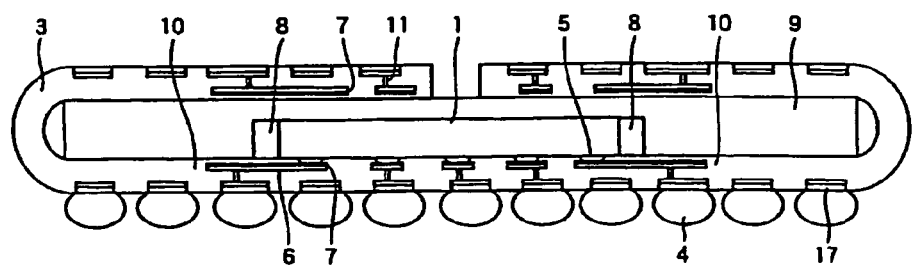
[FIG. 14] is a cross-sectional view showing a semiconductor package in a seventh exemplary embodiment of the present invention.
Figure 15:
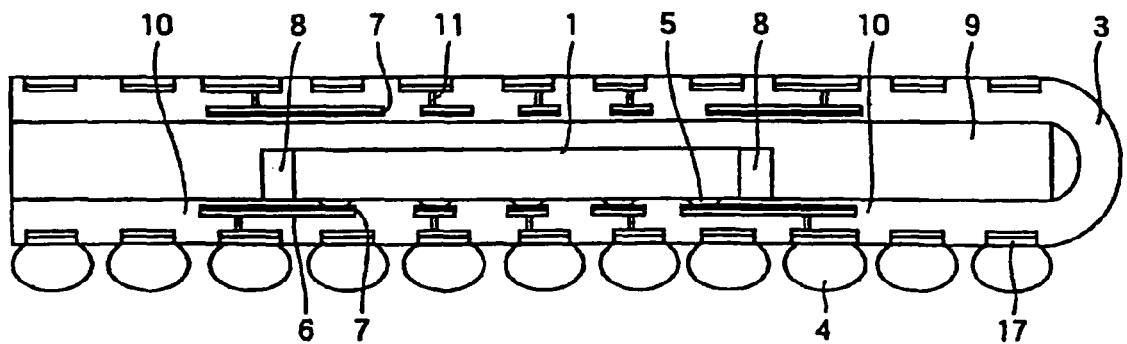
[FIG. 15] is a cross-sectional view showing a semiconductor package in an eighth exemplary embodiment of the present invention.
Figure 16:
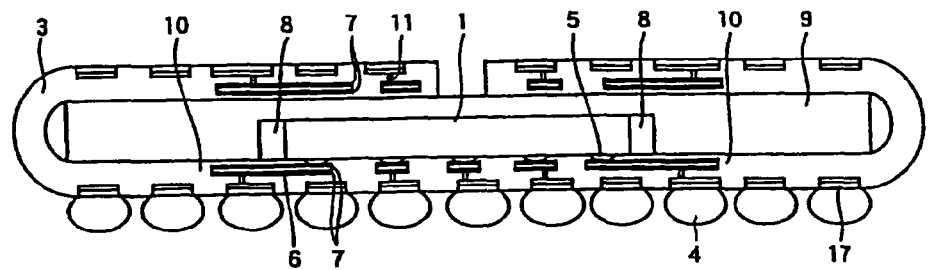
[FIG. 16] is a cross-sectional view showing a semiconductor package in a ninth exemplary embodiment of the present invention.
Figure 17:
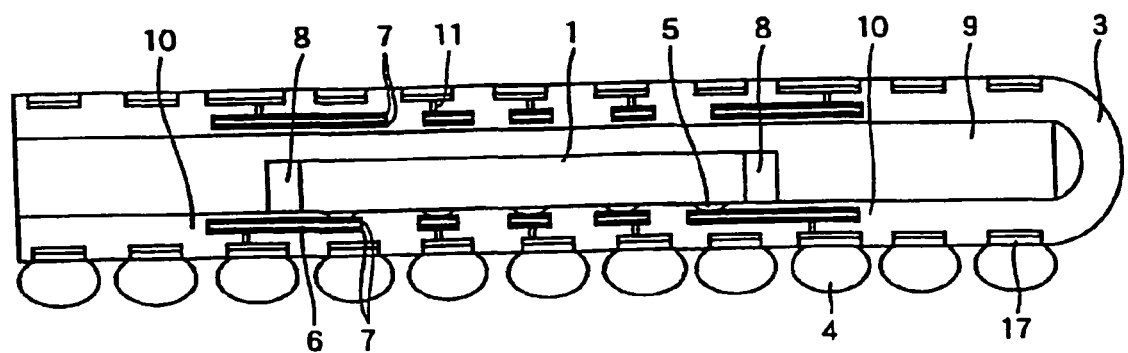
[FIG. 17] is a cross-sectional view showing a semiconductor package in a tenth exemplary embodiment of the present invention.
Figure 18:
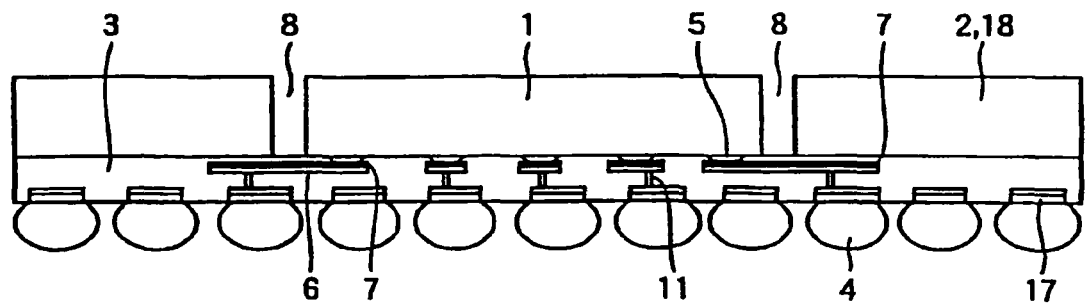
[FIG. 18] is a cross-sectional view showing a semiconductor package in an 11th exemplary embodiment of the present invention.
Figure 19:
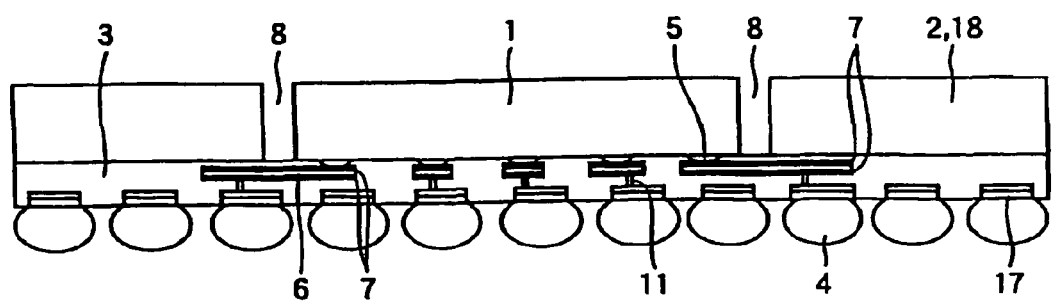
[FIG. 19] is a cross-sectional view showing a semiconductor package in a 12th exemplary embodiment of the present invention.
Figure 20:
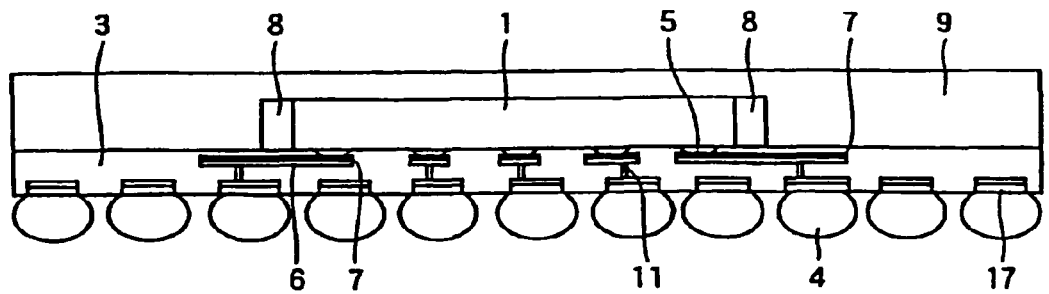
[FIG. 20] is a cross-sectional view showing a semiconductor package in a 13th exemplary embodiment of the present invention.
Figure 21:
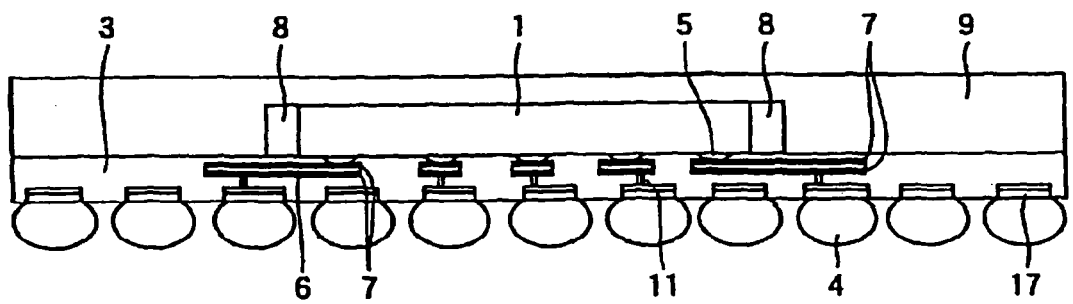
[FIG. 21] is a cross-sectional view showing a semiconductor package in a 14th exemplary embodiment of the present invention.
Figure 22:
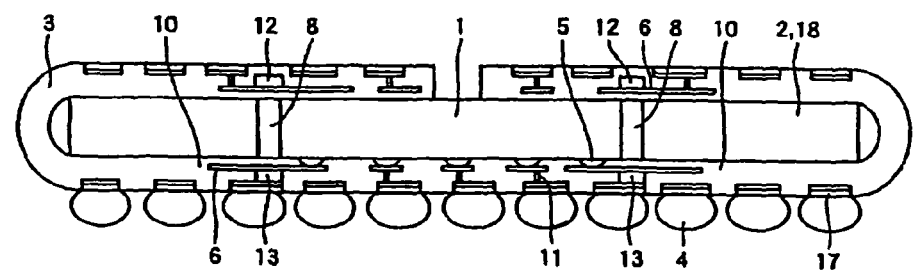
[FIG. 22] is a cross-sectional view showing a semiconductor package in a 15th exemplary embodiment of the present invention.
Figure 23:
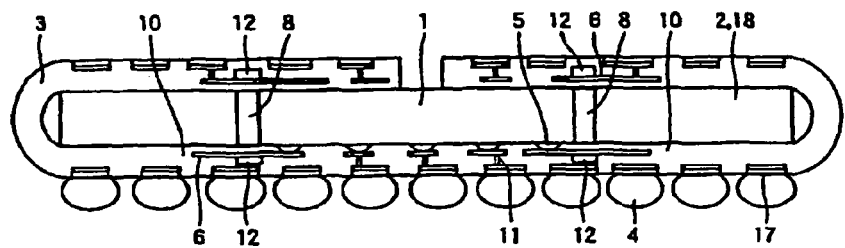
[FIG. 23] is a cross-sectional view showing a semiconductor package in a 15th exemplary embodiment of the present invention.
Figure 24:
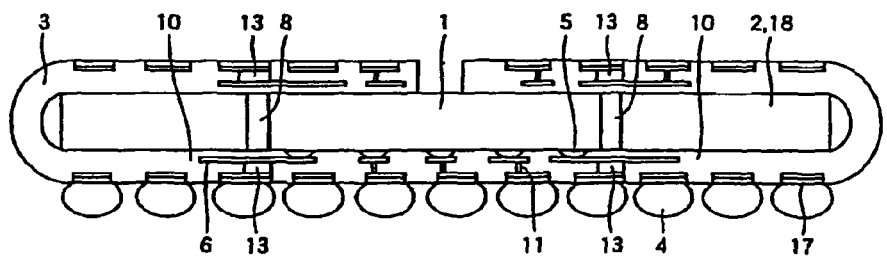
[FIG. 24] is a cross-sectional view showing a semiconductor package in a 15th exemplary embodiment of the present invention.
Figure 25:
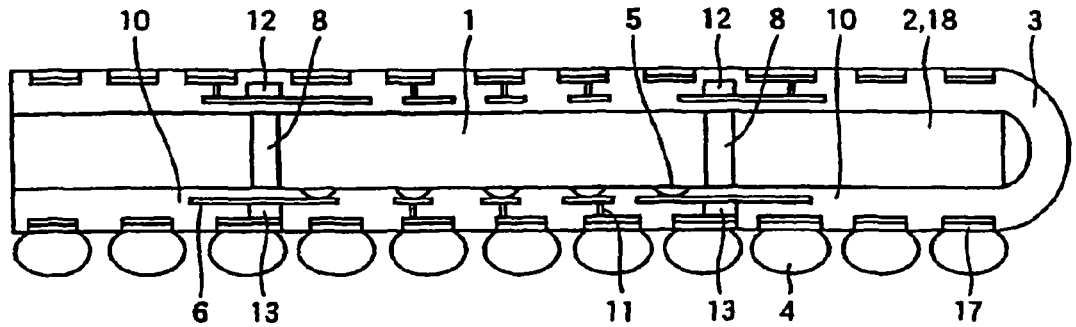
[FIG. 25] is a cross-sectional view showing a semiconductor package in a 16th exemplary embodiment of the present invention.
Figure 26:
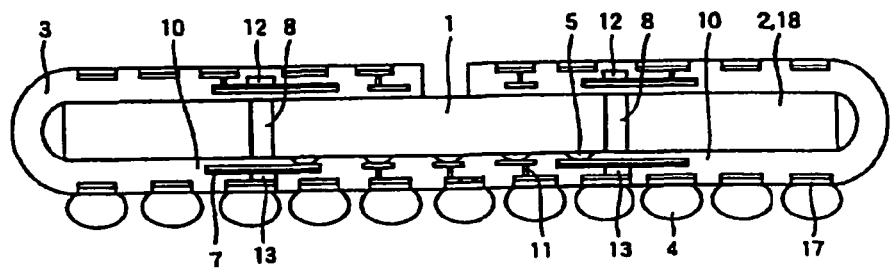
[FIG. 26] is a cross-sectional view showing a semiconductor package in a 17th exemplary embodiment of the present invention.
Figure 27:
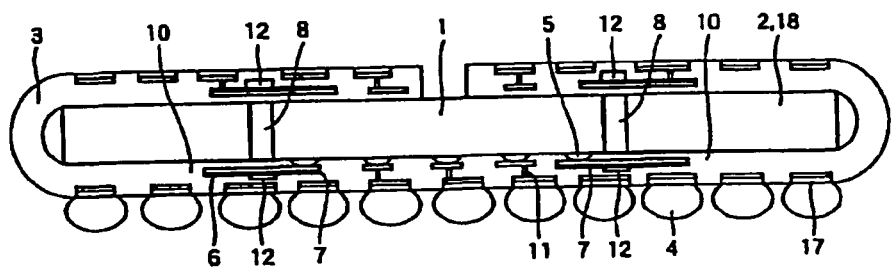
[FIG. 27] is a cross-sectional view showing a semiconductor package in a 17th exemplary embodiment of the present invention.
Figure 28:
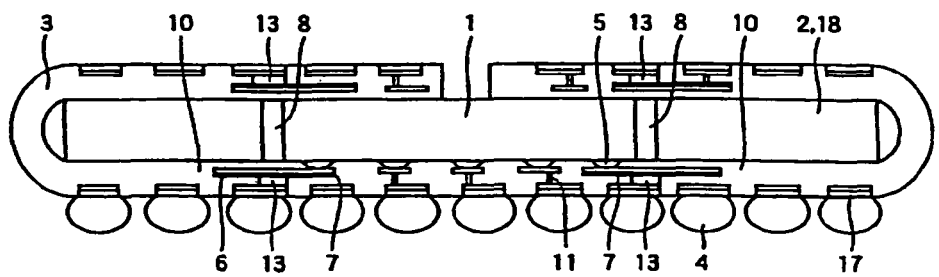
[FIG. 28] is a cross-sectional view showing a semiconductor package in an 17th exemplary embodiment of the present invention.
Figure 29:
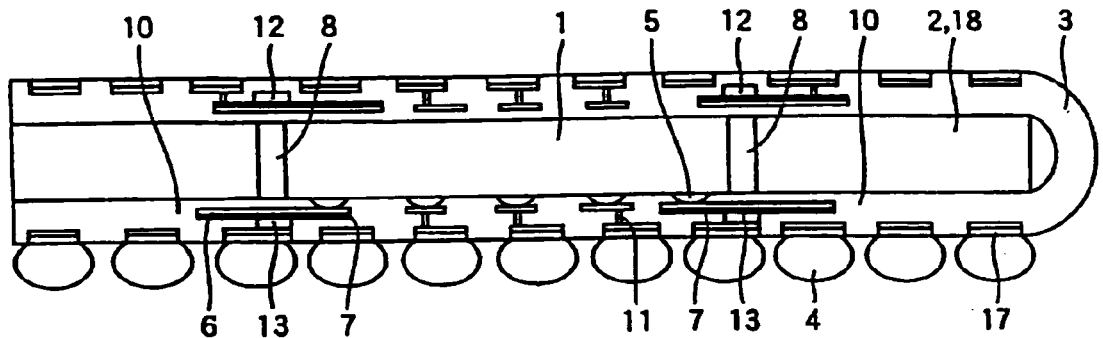
[FIG. 29] is a cross-sectional view showing a semiconductor package in a 18th exemplary embodiment of the present invention.
Figure 30:
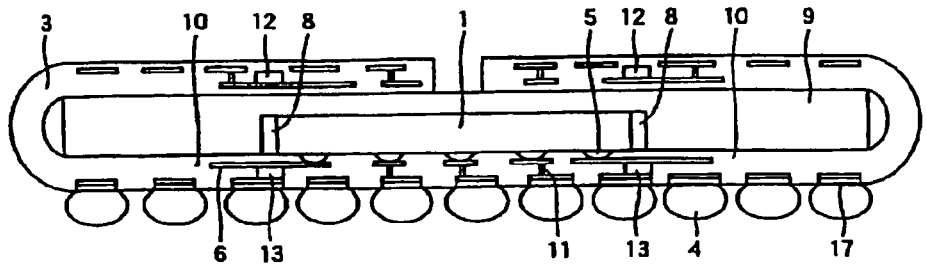
[FIG. 30] is a cross-sectional view showing a semiconductor package in a 19th exemplary embodiment of the present invention.
Figure 31:
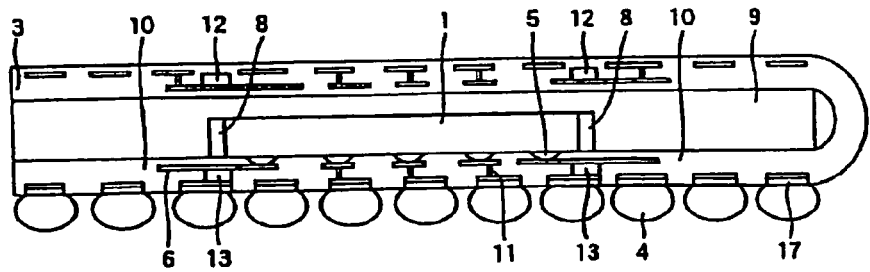
[FIG. 31] is a cross-sectional view showing a semiconductor package in a 20th exemplary embodiment of the present invention.
Figure 32:
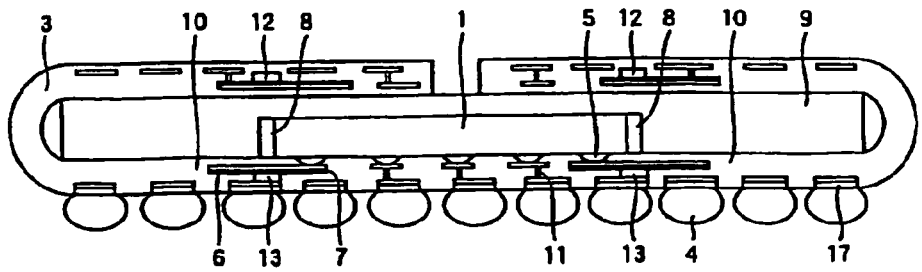
[FIG. 32] is a cross-sectional view showing a semiconductor package in a 21st exemplary embodiment of the present invention.
Figure 33:
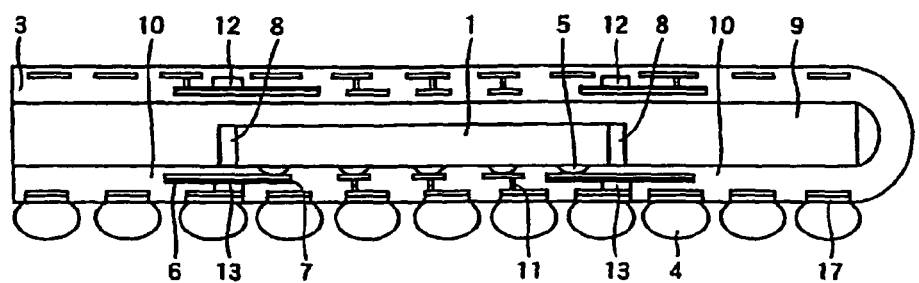
[FIG. 33] is a cross-sectional view showing a semiconductor package in a 22nd exemplary embodiment of the present invention.
Figure 34:
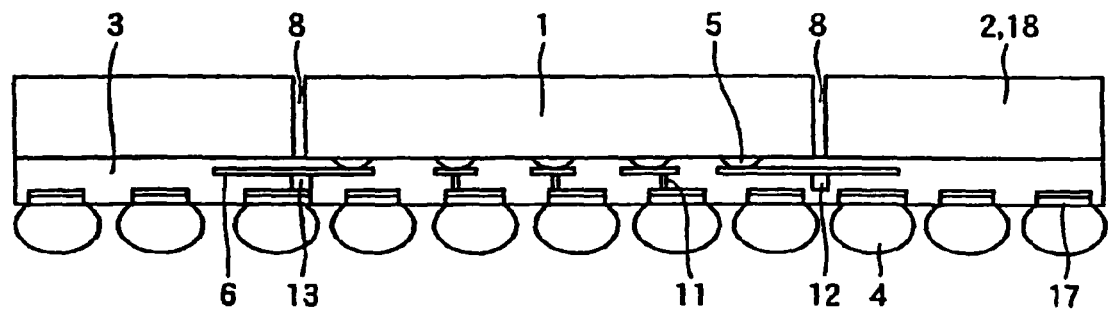
[FIG. 34] is a cross-sectional view showing a semiconductor package in a 23rd exemplary embodiment of the present invention.
Figure 35:
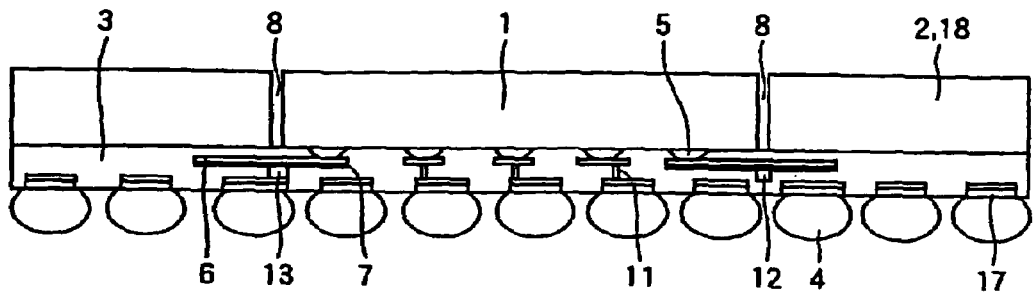
[FIG. 35] is a cross-sectional view showing a semiconductor package in a 24th exemplary embodiment of the present invention.
Figure 36:
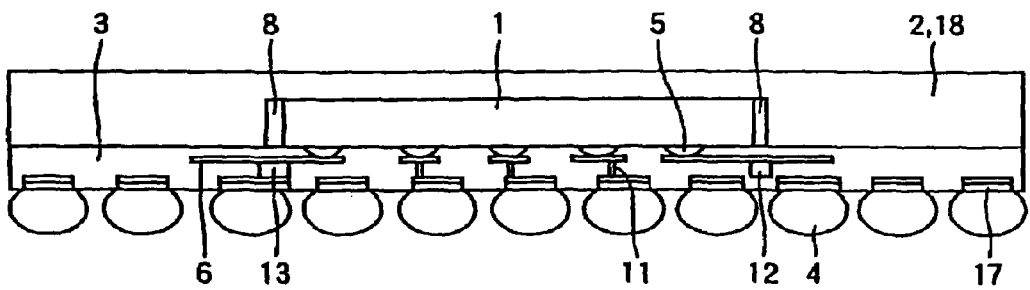
[FIG. 36] is a cross-sectional view showing a semiconductor package in a 25th exemplary embodiment of the present invention.
Figure 37:
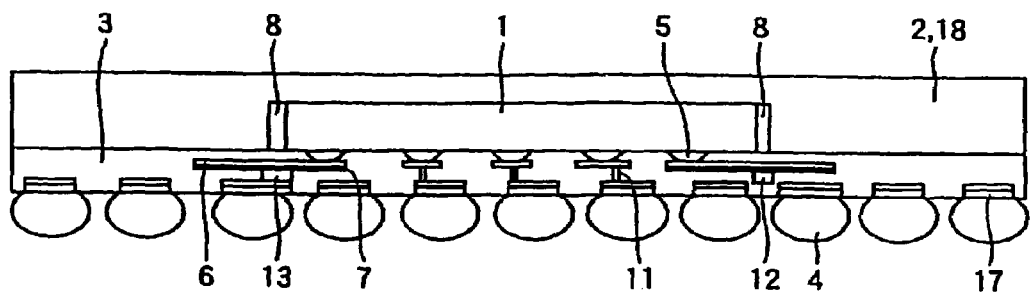
[FIG. 37] is a cross-sectional view showing a semiconductor package in a 26th exemplary embodiment of the present invention.
Figure 38:
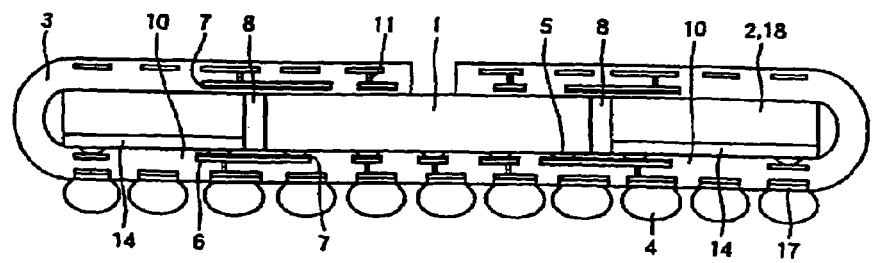
[FIG. 38] is a cross-sectional view showing a semiconductor package in a 27th exemplary embodiment of the present invention.
Figure 39:
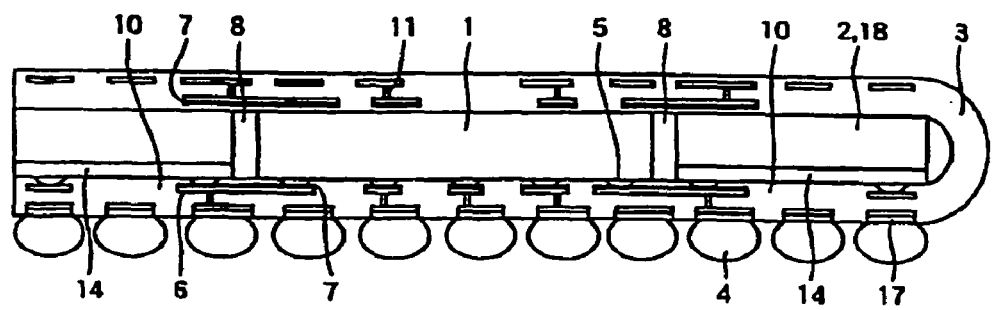
[FIG. 39] is a cross-sectional view showing a semiconductor package in a 28th exemplary embodiment of the present invention.
Figure 40:
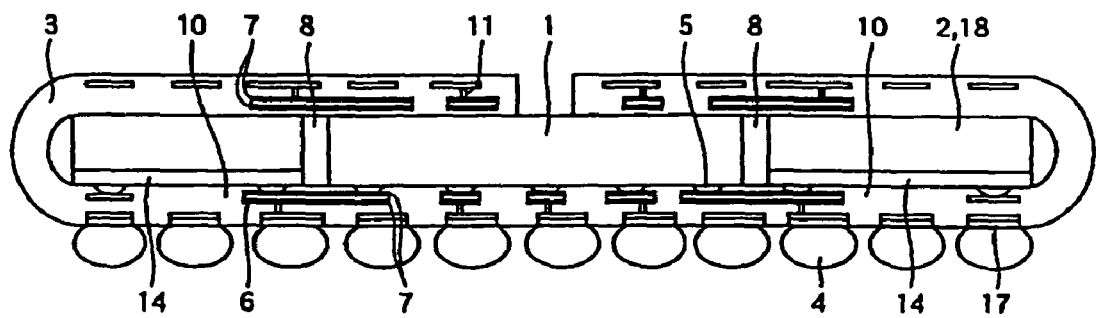
[FIG. 40] is a cross-sectional view showing a semiconductor package in a 29th exemplary embodiment of the present invention.
Figure 41:
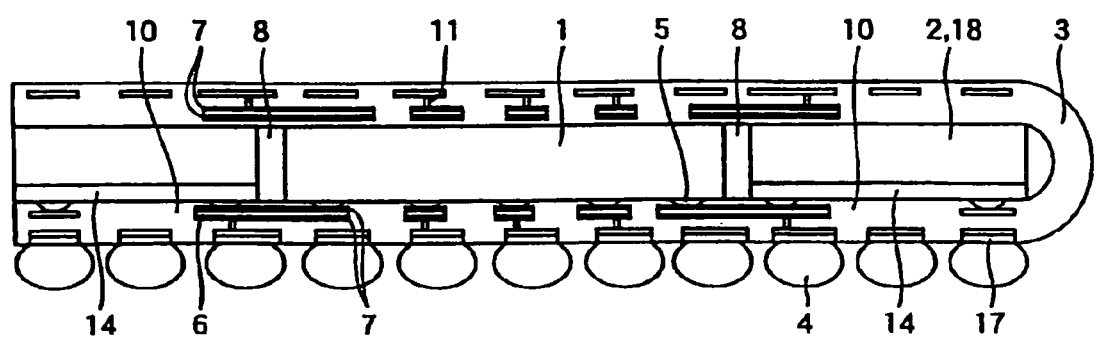
[FIG. 41] is a cross-sectional view showing a semiconductor package in a 30th exemplary embodiment of the present invention.
Figure 42:
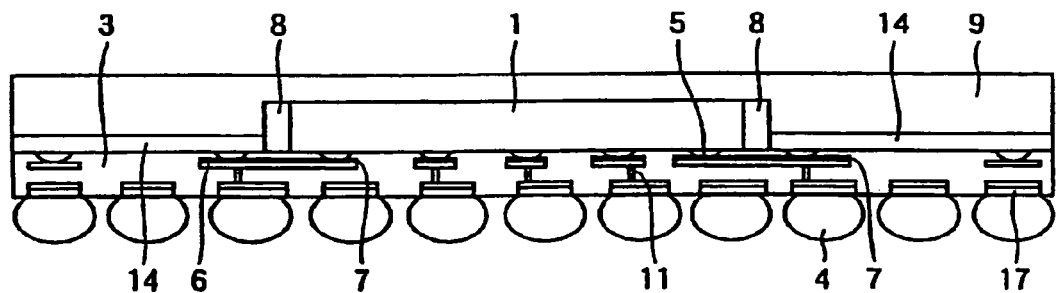
[FIG. 42] is a cross-sectional view showing a semiconductor package in a 31st exemplary embodiment of the present invention.
Figure 43:
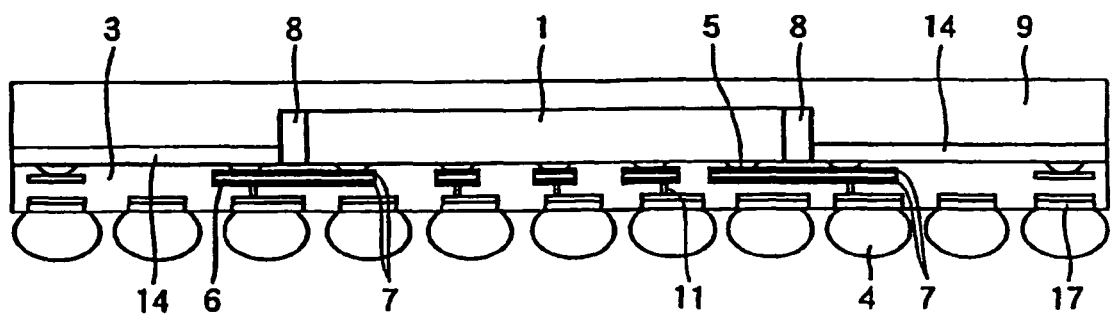
[FIG. 43] is a cross-sectional view showing a semiconductor package in a 32nd exemplary embodiment of the present invention.
Figure 44:
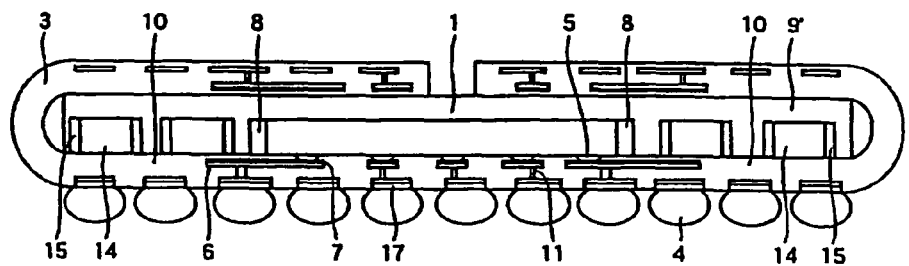
[FIG. 44] is a cross-sectional view showing a semiconductor package in a 33rd exemplary embodiment of the present invention.
Figure 45:
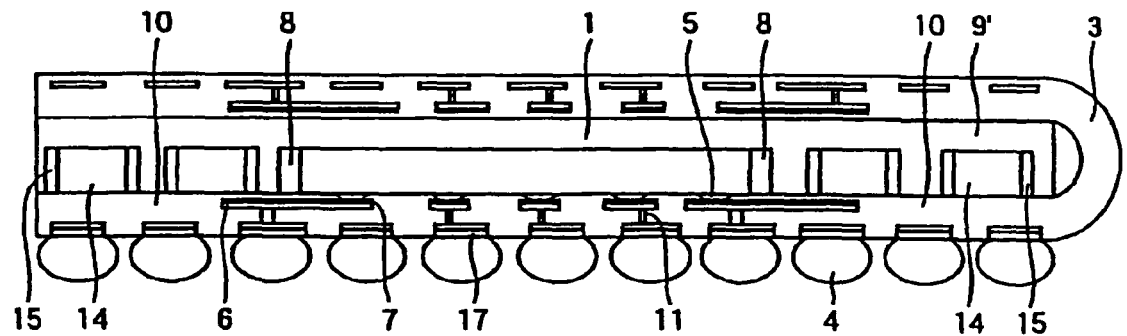
[FIG. 45] is a cross-sectional view showing a semiconductor package in a 34th exemplary embodiment of the present invention.
Figure 46:
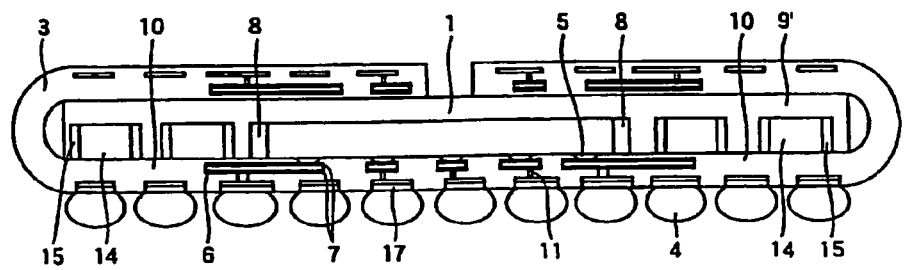
[FIG. 46] is a cross-sectional view showing a semiconductor package in a 35th exemplary embodiment of the present invention.
Figure 47:
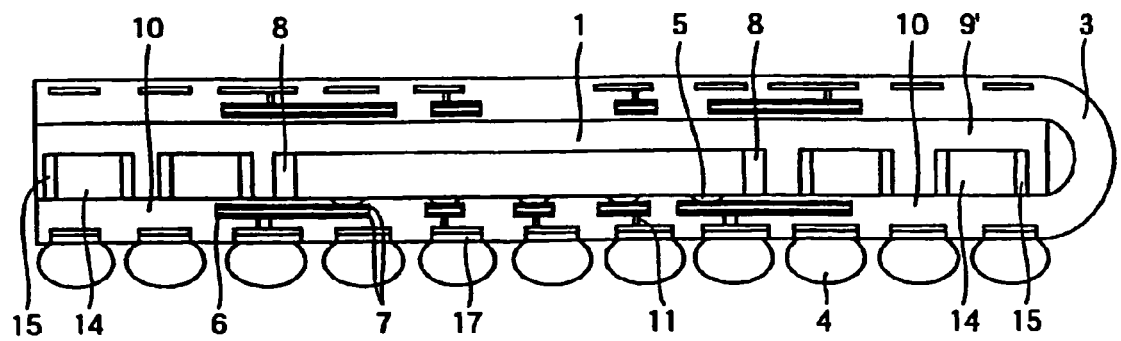
[FIG. 47] is a cross-sectional view showing a semiconductor package in a 36th exemplary embodiment of the present invention.
Figure 48:
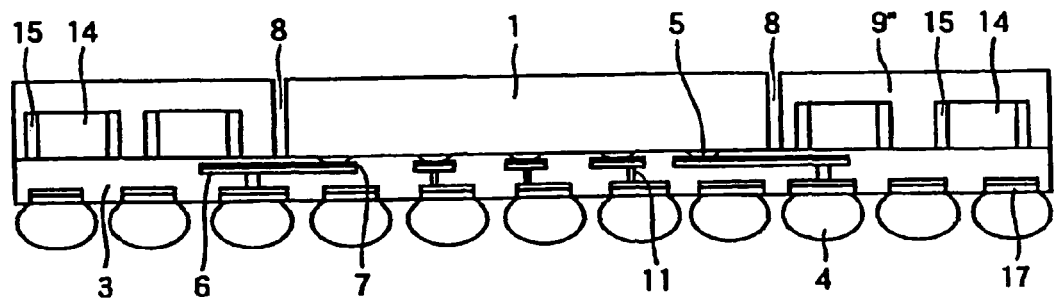
[FIG. 48] is a cross-sectional view showing a semiconductor package in a 37th exemplary embodiment of the present invention.
Figure 49:
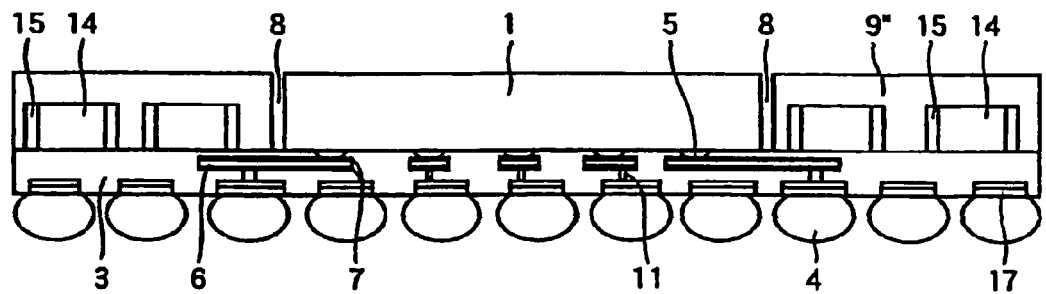
[FIG. 49] is a cross-sectional view showing a semiconductor package in a 38th exemplary embodiment of the present invention.
Figure 50:
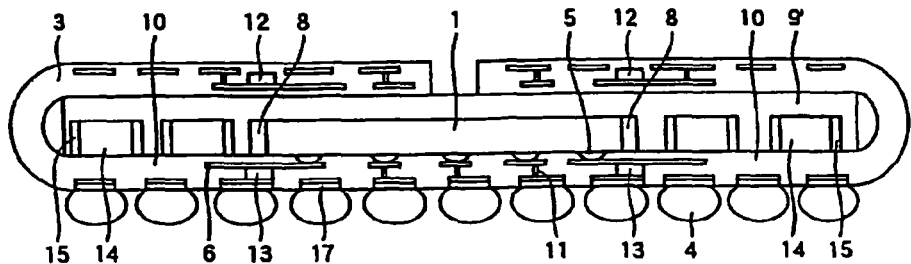
[FIG. 50] is a cross-sectional view showing a semiconductor package in an 39th exemplary embodiment of the present invention.
Figure 51:
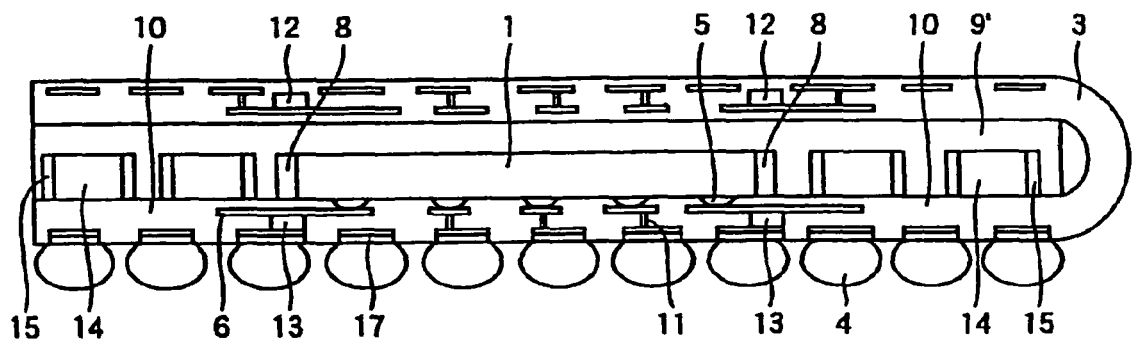
[FIG. 51] is a cross-sectional view showing a semiconductor package in a 40th exemplary embodiment of the present invention.
Figure 52:
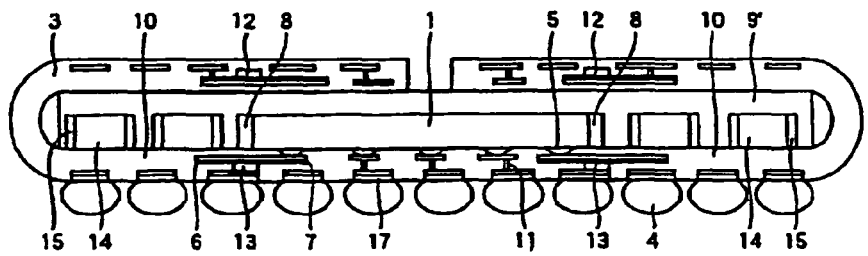
[FIG. 52] is a cross-sectional view showing a semiconductor package in a 41st exemplary embodiment of the present invention.
Figure 53:
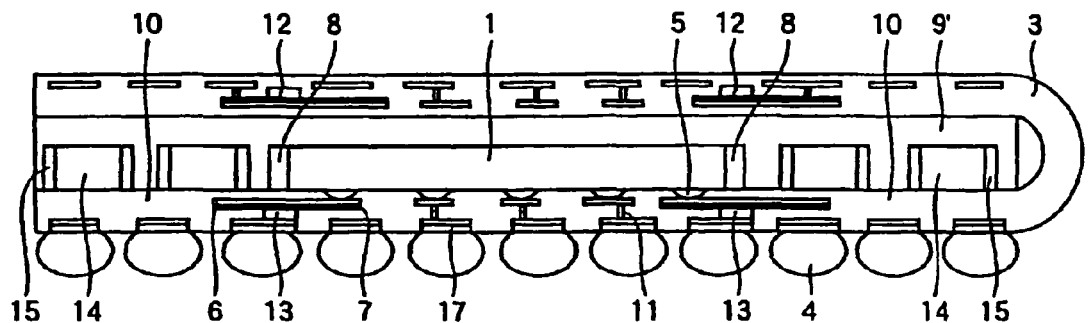
[FIG. 53] is a cross-sectional view showing a semiconductor package in a 42nd exemplary embodiment of the present invention.
Figure 54:
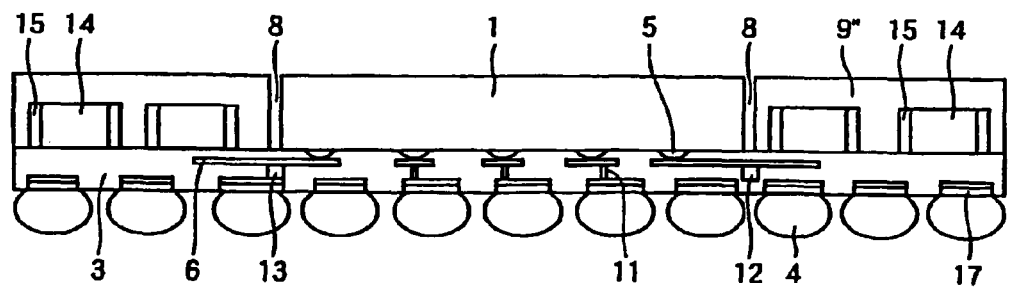
[FIG. 54] is a cross-sectional view showing a semiconductor package in a 43rd exemplary embodiment of the present invention.
Figure 55:
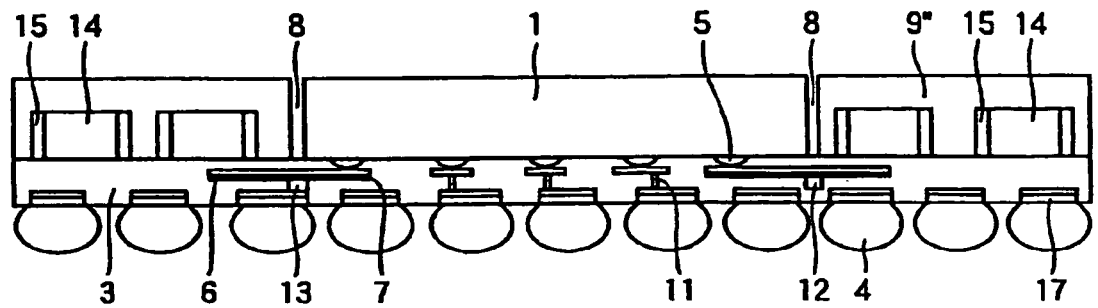
[FIG. 55] is a cross-sectional view showing a semiconductor package in a 44th exemplary embodiment of the present invention.
Figure 56:
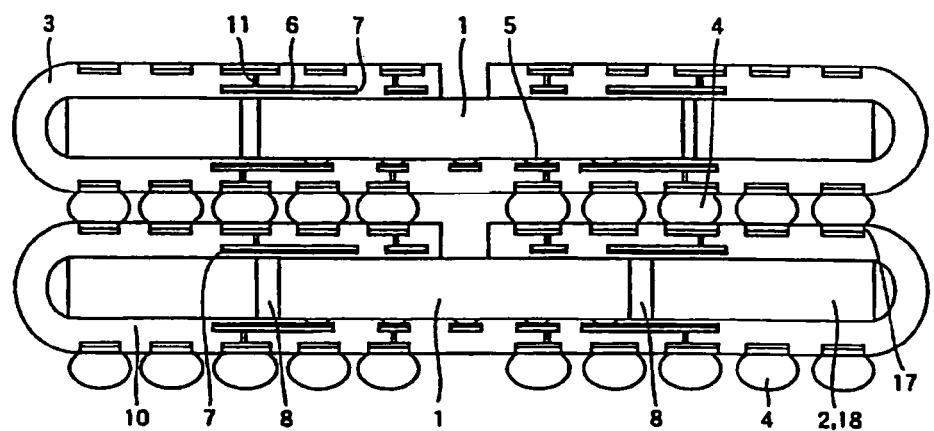
[FIG. 56] is a cross-sectional view showing a semiconductor package in a 45th exemplary embodiment of the present invention.
Figure 57:
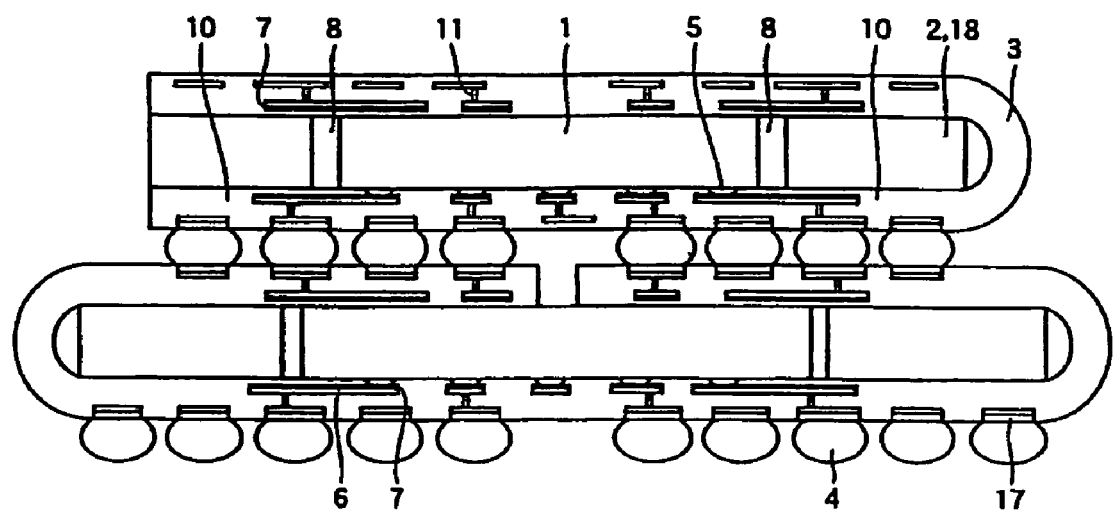
[FIG. 57] is a cross-sectional view showing a semiconductor package in a 46th exemplary embodiment of the present invention.
Figure 58:
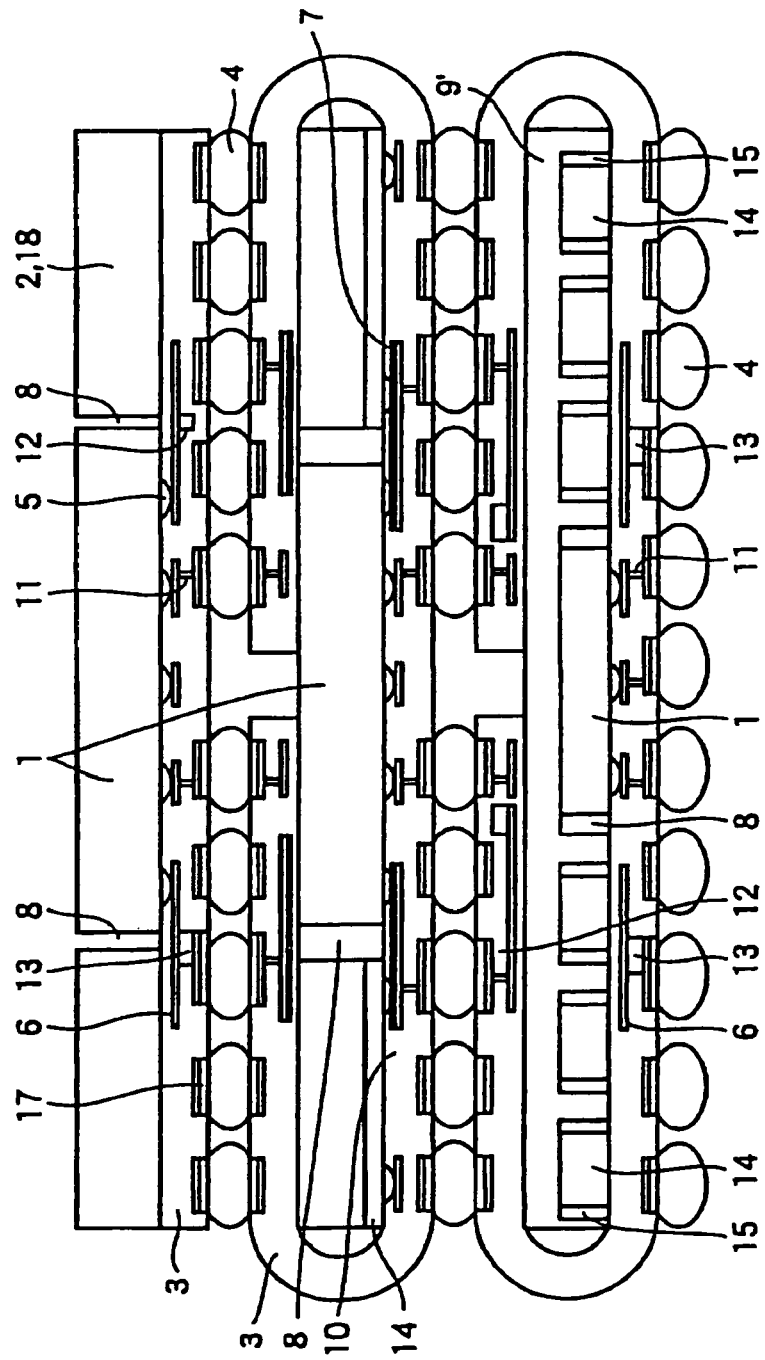
[FIG. 58] is a cross-sectional view showing a semiconductor package in a 47th exemplary embodiment of the present invention.
Figure 59:
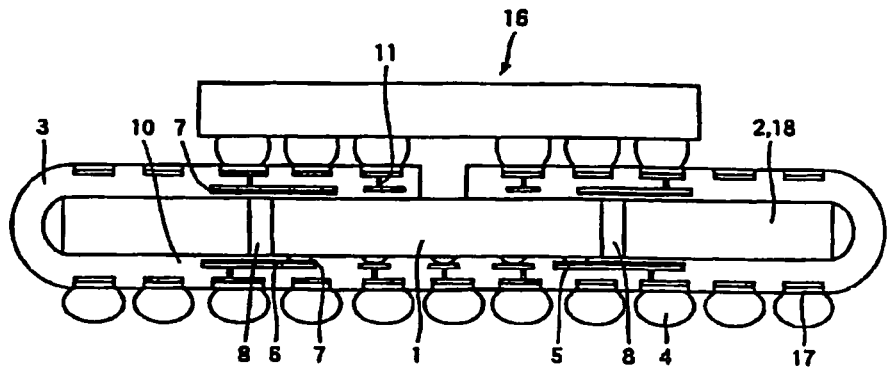
[FIG. 59] is a cross-sectional view showing a semiconductor package in a 48th exemplary embodiment of the present invention.
Figure 60:
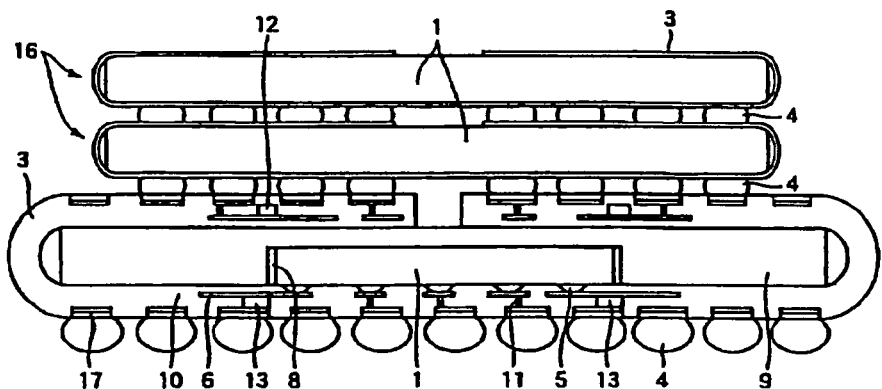
[FIG. 60] is a cross-sectional view showing a semiconductor package in a 49th exemplary embodiment of the present invention.
Figure 61:
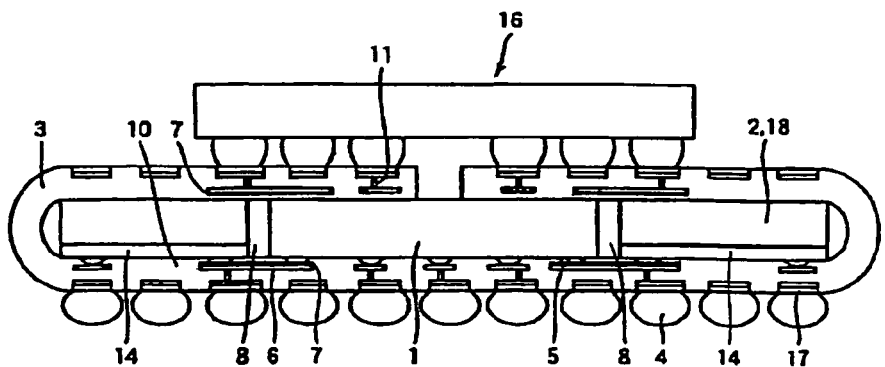
[FIG. 61] is a cross-sectional view showing a semiconductor package in a 50th exemplary embodiment of the present invention.
Figure 62:
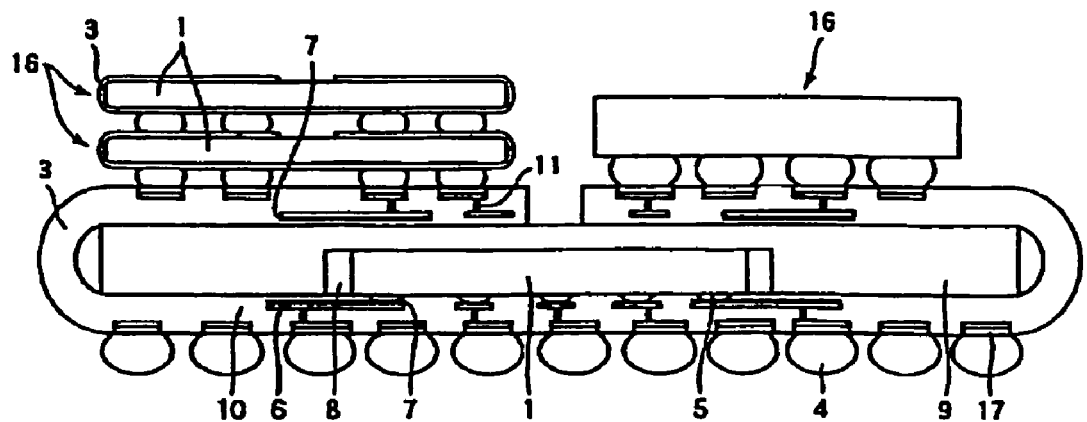
[FIG. 62] is a cross-sectional view showing a semiconductor package in a 51st exemplary embodiment of the present invention.

1 Semiconductor device
2, 9, 18 Insertion substrate
3 Interposer substrate
4 Solder bump
5 Conductor bump
6 Wiring pattern
7 Metallic film
8 Gap
10 Thermoplastic resin
11, 13 Via
12 Metallic projection

The invention claimed is:
1. An electronic device package, comprising:
a flexible interposer substrate including a wiring pattern therein;
at least one electronic device arranged on the interposer substrate; and
an insertion substrate similarly arranged on the interposer substrate, wherein
a reinforcing member is disposed to increase breaking strength of the wiring pattern in an area of the interposer substrate corresponding to a gap between the electronic device and the insertion substrate, and the reinforcing member is formed of a conductive material.

2. An electronic device package, comprising:
a flexible interposer substrate including a wiring pattern therein;

at least one electronic device arranged on the interposer substrate; and an insertion substrate similarly arranged on the interposer substrate, wherein a reinforcing member is disposed to increase breaking strength of the wiring pattern in an area of the interposer substrate corresponding to a gap between the electronic device and the insertion substrate, wherein a metallic film is disposed on the wiring pattern as the reinforcing member.

3. The electronic device package in accordance with claim 2, wherein the metallic film is disposed on both surfaces of the wiring pattern.

4. The electronic device package in accordance with claim 2, wherein tensile strength of a material of the metallic film is higher than that of a material of the wiring pattern.

5. An electronic device package, comprising:

a flexible interposer substrate including a wiring pattern therein;

at least one electronic device arranged on the interposer substrate; and an insertion substrate similarly arranged on the interposer substrate, wherein a reinforcing member is disposed to increase breaking strength of the wiring pattern in an area of the interposer substrate corresponding to a gap between the electronic device and the insertion substrate, wherein as the reinforcing member, there is disposed a metallic projection which is a projection of a portion of the wiring pattern.

6. The electronic device package in accordance with claim 5, wherein between the metallic projection and the wiring pattern, there is formed a metallic film higher in tensile strength than the material of the wiring pattern.

7. The electronic device package in accordance with claim 1, wherein the interposer substrate includes at least two layers of the wiring patterns, and a via filled with a conductor is disposed as the reinforcing member to establish connection between the wiring patterns.

8. The electronic device package in accordance with claim 1, wherein an end section of the interposer substrate is bent to cover part of the insertion substrate and/or the electronic device.

9. The electronic device package in accordance with claim 1, wherein part of a resin comprising the interposer substrate is a thermoplastic resin.

10. The electronic device package in accordance with claim 1, wherein the insertion substrate includes a through-hole to accommodate the electronic device therein, and the gap is formed between an inner circumference of the through-hole and an outer circumference of the electronic device.

11. The electronic device package in accordance with claim 1, wherein the insertion substrate includes a cavity to accommodate the electronic device therein, and the gap is formed between an inner circumference of the cavity and an outer circumference of the electronic device.

12. The electronic device package in accordance with claim 1, wherein a passive element is formed between the insertion substrate and the interposer substrate.

13. The electronic device package, comprising electronic device packages in accordance with claim 1, the packages being laminated in a plurality of layers.

14. The electronic device package, comprising a combination of at least one first electronic device package in accordance with claim 1 and at least one second electronic device package different in structure from the electronic device packages in accordance with claim 1, the packages being laminated onto each other.

15. The module in which the electronic device package in accordance with claim 1 is installed on a circuit board.

16. The electronic apparatus in which the electronic device package in accordance with claim 1 is installed on a circuit board.

17. The electronic device package in accordance with claim 3, wherein tensile strength of a material of the metallic film is higher than that of a material of the wiring pattern.

18. The electronic device package in accordance with claim 1, wherein the reinforcing member is disposed over an area opposing the gap for at least either an upper surface or a rear surface of at least the wiring pattern located in a place closest to the gap.

19. The electronic device package in accordance with claim 18, wherein the wiring pattern located in a place closest to the gap is disposed so as to extend over the width of the gap.

* * * * *

UNITED STATES PATENT AND TRADEMARK OFFICE
CERTIFICATE OF CORRECTION

PATENT NO. : 7,812,440 B2
APPLICATION NO. : 12/223963
DATED : October 12, 2010
INVENTOR(S) : Takao Yamazaki et al.

It is certified that error appears in the above-identified patent and that said Letters Patent is hereby corrected as shown below:

On the Title page, a second Assignee should be included and reads as:

NEC Electronics Corporation, Kanagawa (JP)

Signed and Sealed this
Twenty-fifth Day of January, 2011

David J. Kappos
*Director of the United States Patent and Trademark Office*